(12) United States Patent
Hirota et al.

(10) Patent No.: US 8,309,958 B2
(45) Date of Patent: Nov. 13, 2012

(54) SEMICONDUCTOR MEMORY DEVICE AND METHOD OF MANUFACTURING SAME

(75) Inventors: Jun Hirota, Kanagawa-ken (JP); Yoko Iwakaji, Kanagawa-ken (JP); Moto Yabuki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 186 days.

(21) Appl. No.: 12/872,284

(22) Filed: Aug. 31, 2010

(65) Prior Publication Data

US 2011/0227025 A1  Sep. 22, 2011

(30) Foreign Application Priority Data

Mar. 16, 2010  (JP) ................. 2010-058780

(51) Int. Cl.
*H01L 29/06* (2006.01)
*H01L 29/12* (2006.01)
*H01L 45/00* (2006.01)
(52) U.S. Cl. .......... 257/49; 257/E45.002; 257/653; 257/4; 438/237
(58) Field of Classification Search .................. None
See application file for complete search history.

(56) References Cited

U.S. PATENT DOCUMENTS

| 7,824,954 B2* | 11/2010 | An et al. ............ 438/102 |
| 8,084,830 B2* | 12/2011 | Kanno et al. .......... 257/379 |
| 2009/0017577 A1* | 1/2009 | An et al. ............ 438/102 |
| 2009/0137112 A1* | 5/2009 | Tabata et al. ......... 438/631 |
| 2009/0251940 A1* | 10/2009 | Ito .................. 365/51 |
| 2010/0061136 A1 | 3/2010 | Koyama et al. |
| 2010/0213550 A1* | 8/2010 | Kanno et al. .......... 257/379 |

FOREIGN PATENT DOCUMENTS

| JP | 2007-142311 A | 6/2007 |
| JP | 2009-4725 A | 1/2009 |
| JP | 2009-21602 | 1/2009 |
| JP | 2009-27131 A | 2/2009 |
| JP | 2010-161137 A | 7/2010 |

OTHER PUBLICATIONS

S. Lai "Non-volatile memory technologies: The quest for ever lower cost", IEDM Tech. Dig., pp. 1 2008.*
K. Kamiya, T. Tange, T. Hashimoto, H. Nasu, and Y. Shimizu, Research Reports of the Faculty of Engineering, Mie Univ. 26, 23 (2001).*
U.S. Appl. No. 13/052,143, filed Mar. 21, 2011, Iwakaji, et al.
Japanese Office Action issued Jul. 17, 2012 in Patent Application No. 2010-058780 with English Translation.

* cited by examiner

*Primary Examiner* — Victor A Mandala
*Assistant Examiner* — Joseph Schoenholtz
(74) *Attorney, Agent, or Firm* — Oblon, Spivak, McClelland, Maier & Neustadt, L.L.P.

(57) ABSTRACT

According to one embodiment, a semiconductor memory device includes a word line interconnection layer, a bit line interconnection layer and a pillar. The word line interconnection layer includes a plurality of word lines which extend in a first direction. The bit line interconnection layer includes a plurality of bit lines which extend in a second direction crossing over the first direction. The pillar is arranged between each of the word lines and each of the bit lines. The pillar includes a silicon diode and a variable resistance film, and the silicon diode includes a p-type portion and an n-type portion. The word line interconnection layer and the bit line interconnection layer are alternately stacked, and a compressive force is applied to the silicon diode in a direction in which the p-type portion and the n-type portion become closer to each other.

19 Claims, 16 Drawing Sheets

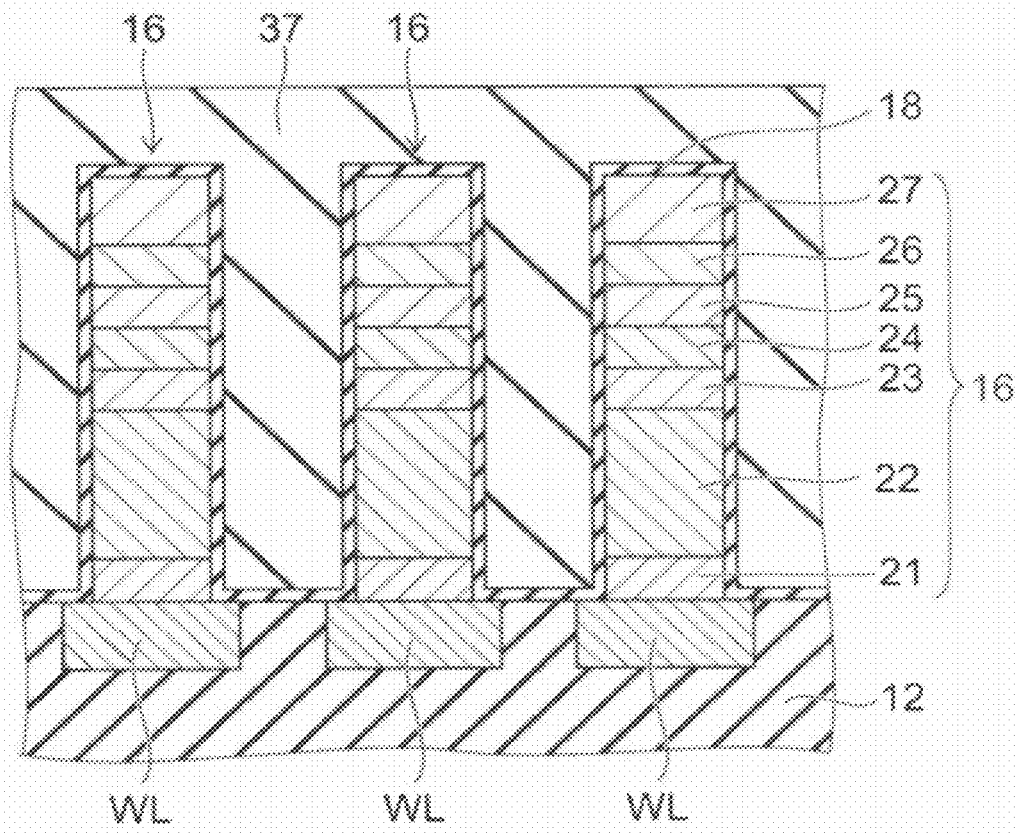
FIG. 9

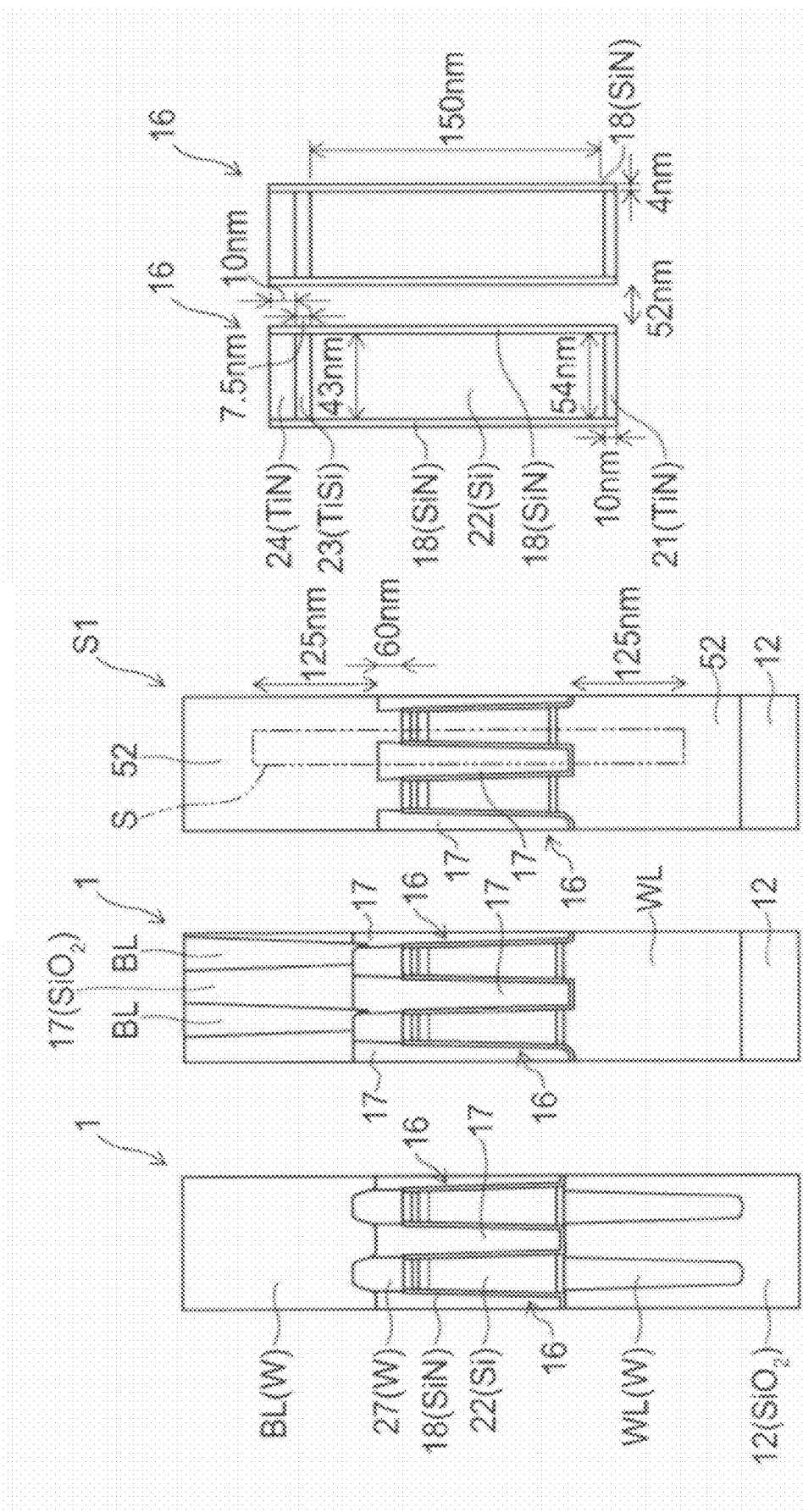

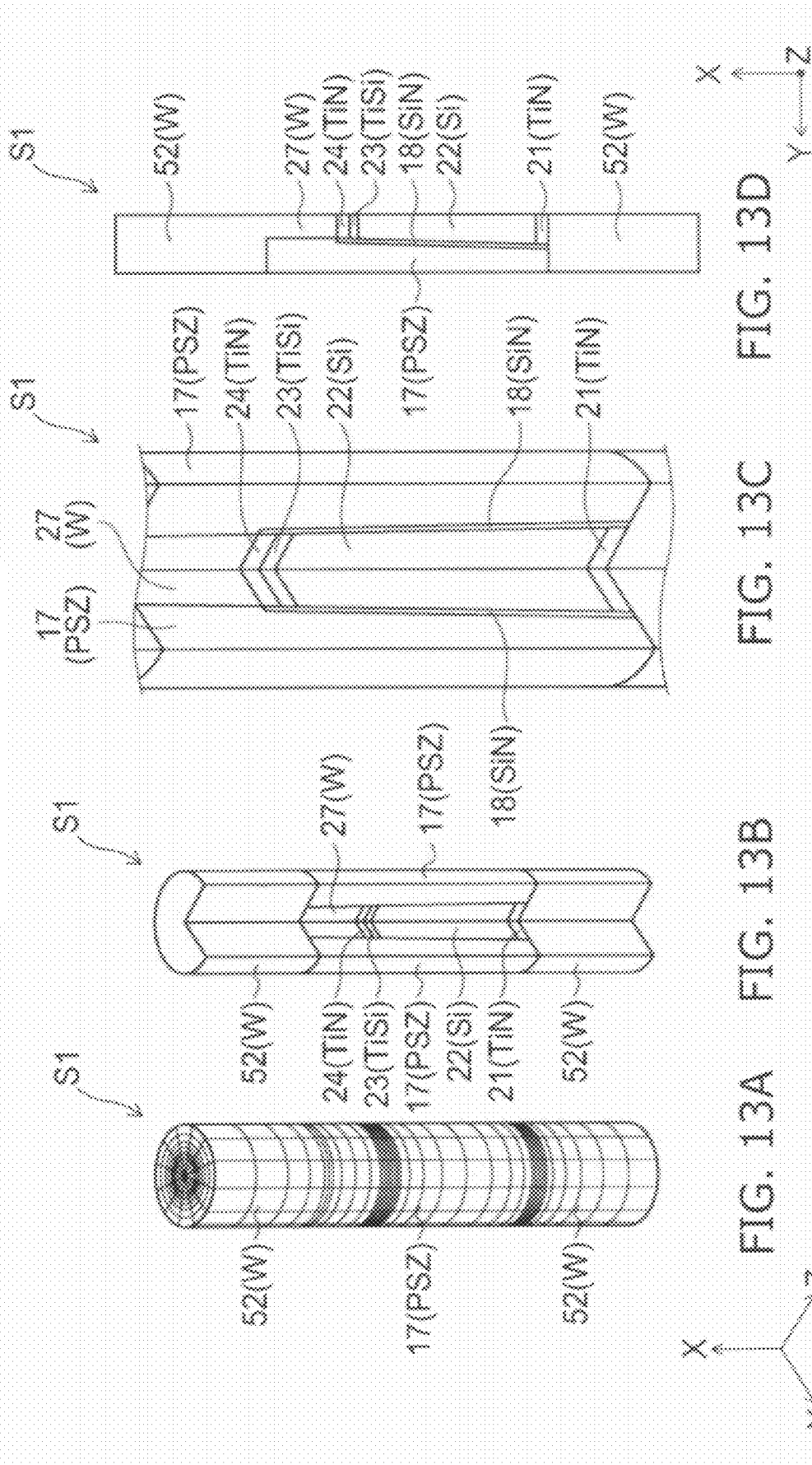

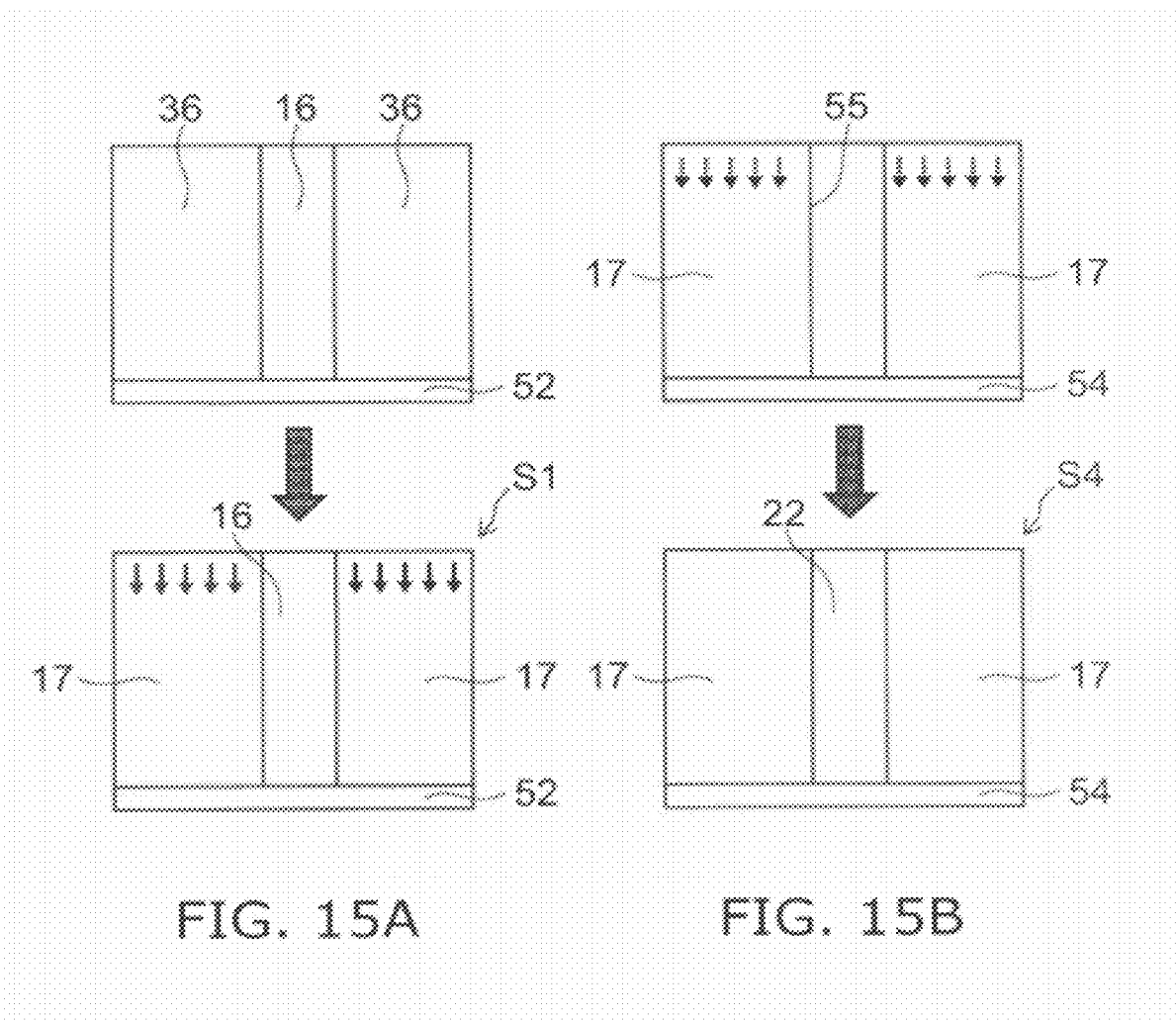

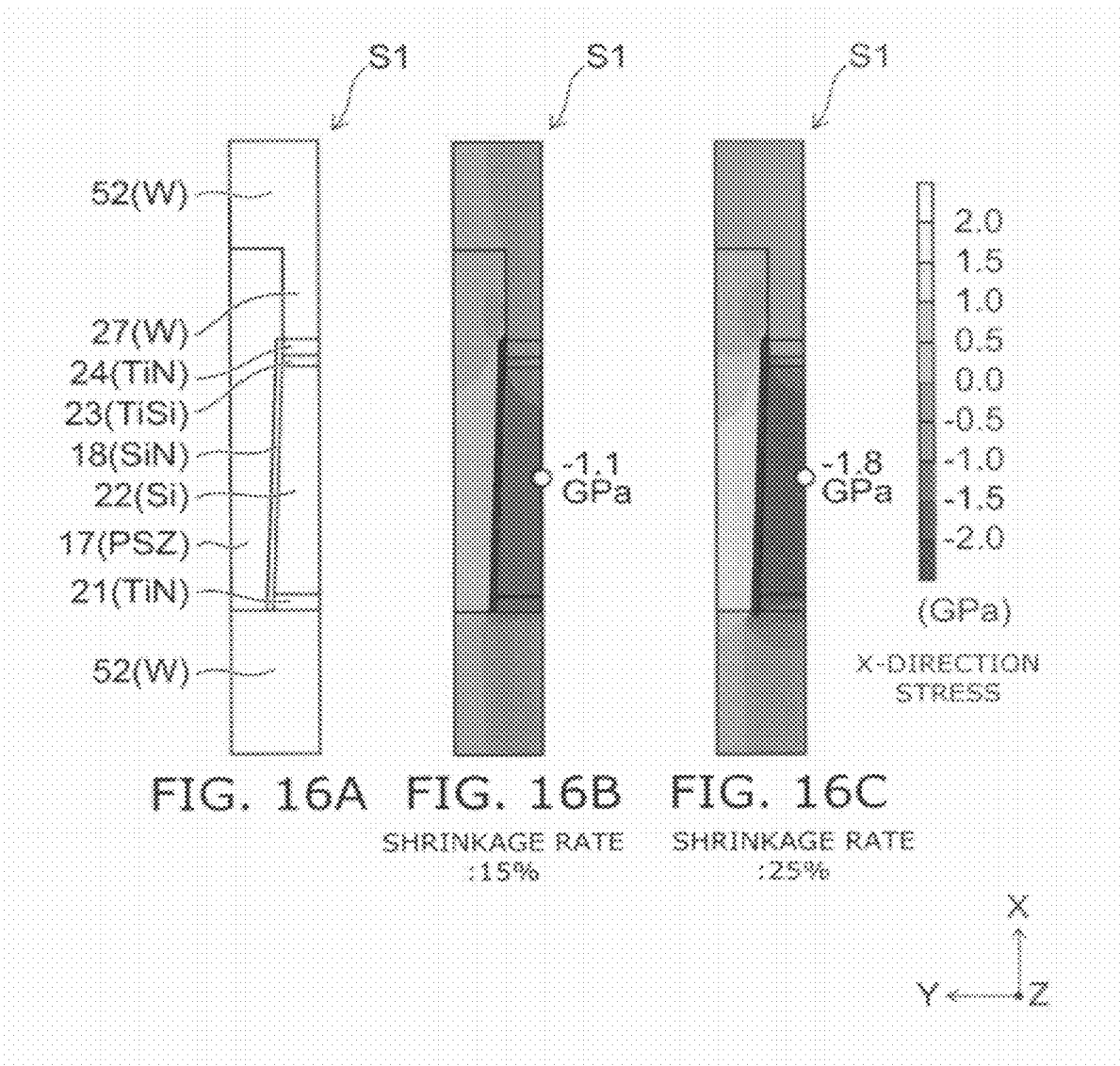

SEMICONDUCTOR MEMORY DEVICE AND METHOD OF MANUFACTURING SAME

CROSS-REFERENCE TO RELATED APPLICATIONS

This application is based upon and claims the benefit of priority from the prior Japanese Patent Application No. 2010-058780, filed on Mar. 16, 2010; the entire contents of which are incorporated herein by reference.

FIELD

Embodiments described herein relate generally to a semiconductor memory device and a method of manufacturing the same.

BACKGROUND

Recently, a phenomenon has been discovered in which, once a voltage is applied to a specific metal oxide-based material, the material exhibits either of two conditions, which include a low resistance condition and a high resistance condition, depending on: a resistivity which the metal oxide-based material has before the voltage is applied: and the magnitude of the voltage applied. A new memory device using this phenomenon attracts attention. This memory device is termed as a ReRAM (Resistance Random Access Memory). From the standpoint of high integration, a three-dimensional cross-point structure in which memory cells are arranged at intersections between WLs (Word Lines) and BLs (Bit Lines) has been proposed as an actual device structure of the ReRAM (for instance, refer to JP-A 2009-021602 (Kokai)).

In the case of the three-dimensional cross-point structure, once a voltage is applied to a certain memory cell for the purpose of writing data to the certain memory cell, a reverse voltage is applied to unselected memory cells as well. For this reason, each memory cell needs to include not only a variable resistance film but also a diode. Examples of the diode in use to this end include a pin-type silicon diode obtained by laminating: a p-type silicon layer doped with acceptors; an i-type silicon layer doped with no impurity; and an n-type silicon layer doped with donors.

In the case of the ReRAM with the three-dimensional cross-point structure, for the purpose of integrating a larger number of memory cells on a single semiconductor memory device, diodes need to be miniaturized as well. However, this miniaturization decreases the area of each diode, and accordingly reduces an amount of forward current in the diode. For the purpose of preventing the malfunction of each memory cell, a certain amount of forward current flowing through the memory cell needs to be ensured. On the other hand, for the purpose of ensuring the reverse breakdown voltage, each diode needs to be securely equal to or longer than a certain length in the direction in which the current flows. This limits the reduction in the resistance by decreasing the length of the diode. For a similar reason, the reduction in the resistance by raising the concentration of an impurity is limited. These factors make it difficult to integrate an even larger number of memory cells on a single semiconductor memory device.

BRIEF DESCRIPTION OF THE DRAWINGS

FIGS. 3 to 11 are process cross-sectional views illustrating a method for manufacturing the semiconductor memory device according to the embodiment;

FIGS. 12A and 12B are cross-sectional views illustrating the semiconductor memory device according to the embodiment, FIG. 12C is a cross-sectional view illustrating a sample which was used as an evaluation object in this experimental example, and FIG. 12D is a partially-enlarged cross-sectional view showing a silicon diode and its vicinity in the sample shown in FIG. 12C;

FIGS. 13A to 13D are diagrams showing the sample which was used as the evaluation object in the experimental example;

FIG. 15A is a schematic cross-sectional view illustrating a process of forming a pillar and a PSZ film in the sample S1, and FIG. 15B is a schematic cross-sectional view illustrating a process of forming a PSZ film and a pillar in the sample S4;

FIG. 16A is a diagram showing the configuration of the sample S1, FIG. 16B is a diagram showing a simulation result of the sample S1 which was obtained in a case where the shrinkage rate of the PSZ film was set at 15%, and FIG. 16C is a diagram showing a simulation result of the sample S1 which was obtained in a case where the shrinkage rate of the PSZ film was set at 25%;

DETAILED DESCRIPTION

In general, according to one embodiment, a semiconductor memory device includes a word line interconnection layer, a bit line interconnection layer and a pillar. The word line interconnection layer includes a plurality of word lines which extend in a first direction. The bit line interconnection layer includes a plurality of bit lines which extend in a second direction crossing over the first direction. The pillar is arranged between each of the word lines and each of the bit lines. The pillar includes a silicon diode and a variable resistance film, and the silicon diode includes a p-type portion and an n-type portion. The word line interconnection layer and the bit line interconnection layer are alternately stacked, and a compressive force is applied to the silicon diode in a direction in which the p-type portion and the n-type portion become closer to each other.

According to another embodiment, a method of manufacturing a semiconductor memory device is disclosed. The method can include forming a word line interconnection layer including a plurality of word lines which extend in a first direction. The method can include forming a bit line interconnection layer including a plurality of bit lines which extend in a second direction crossing over the first direction. The method can include forming a silicon diode by sequentially depositing a p-type silicon and an n-type silicon. The method can include forming a variable resistance film and forming a pillar by selectively removing a part of the silicon diode and a part of the variable resistance film. The method can include placing a solution containing perhydrosilazane polymer around the pillar, and forming a silicon oxide film by heating the solution. The forming the word line interconnection layer and the forming of the bit line interconnection layer are alternately carried out, and the forming the silicon diode, the forming the variable resistance film, the forming the pillar, the placing the solution, and the forming the silicon oxide film are carried out between the forming the word line interconnection layer and the forming the bit line interconnection layer.

Hereinbelow, descriptions will be provided for an embodiment of the invention with reference to the drawings.

Figure 1:
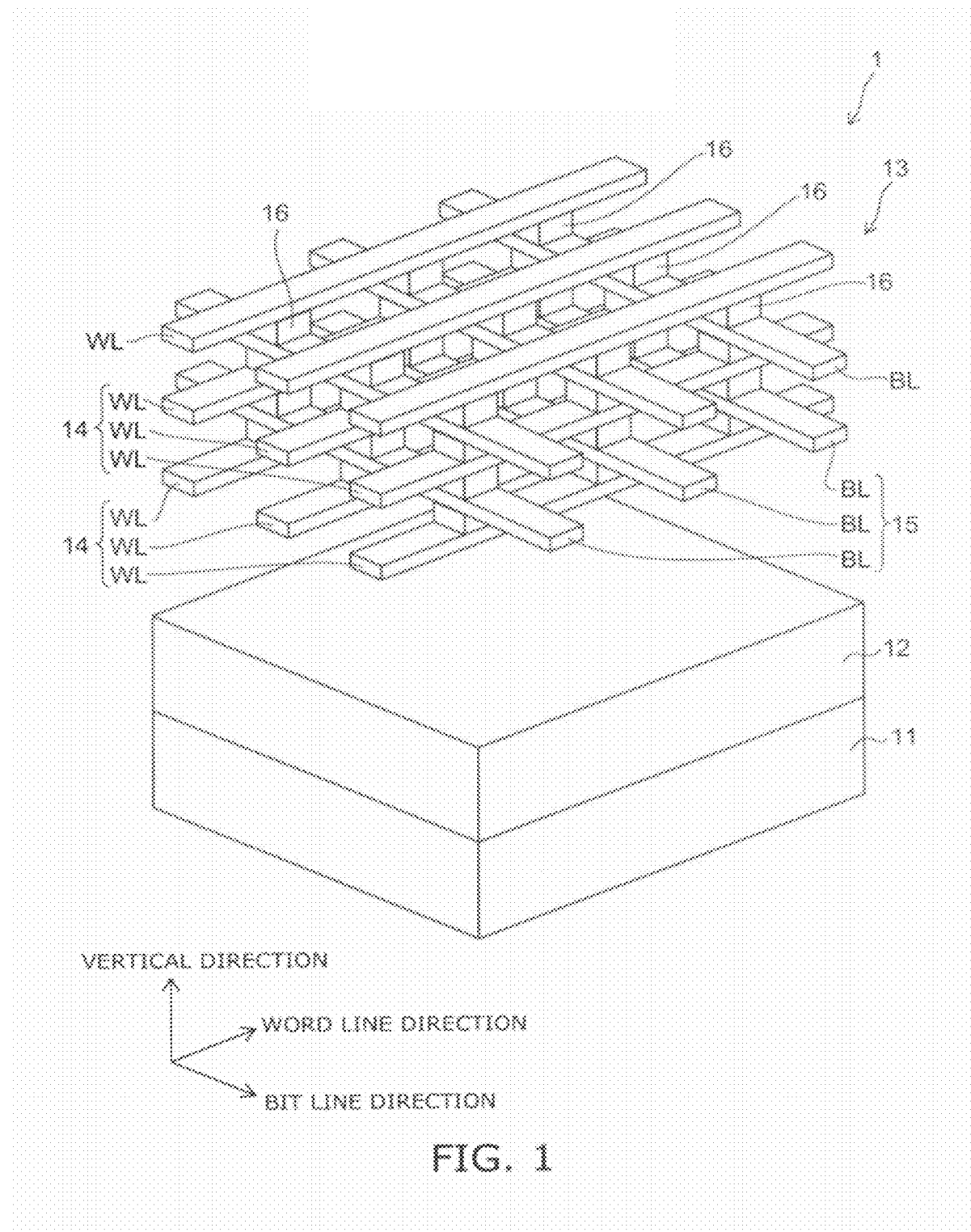
FIG. 1 is a perspective view illustrating a semiconductor memory device according to an embodiment.

FIG. 1 is a perspective view illustrating a semiconductor memory device according to the embodiment.

Figure 2:
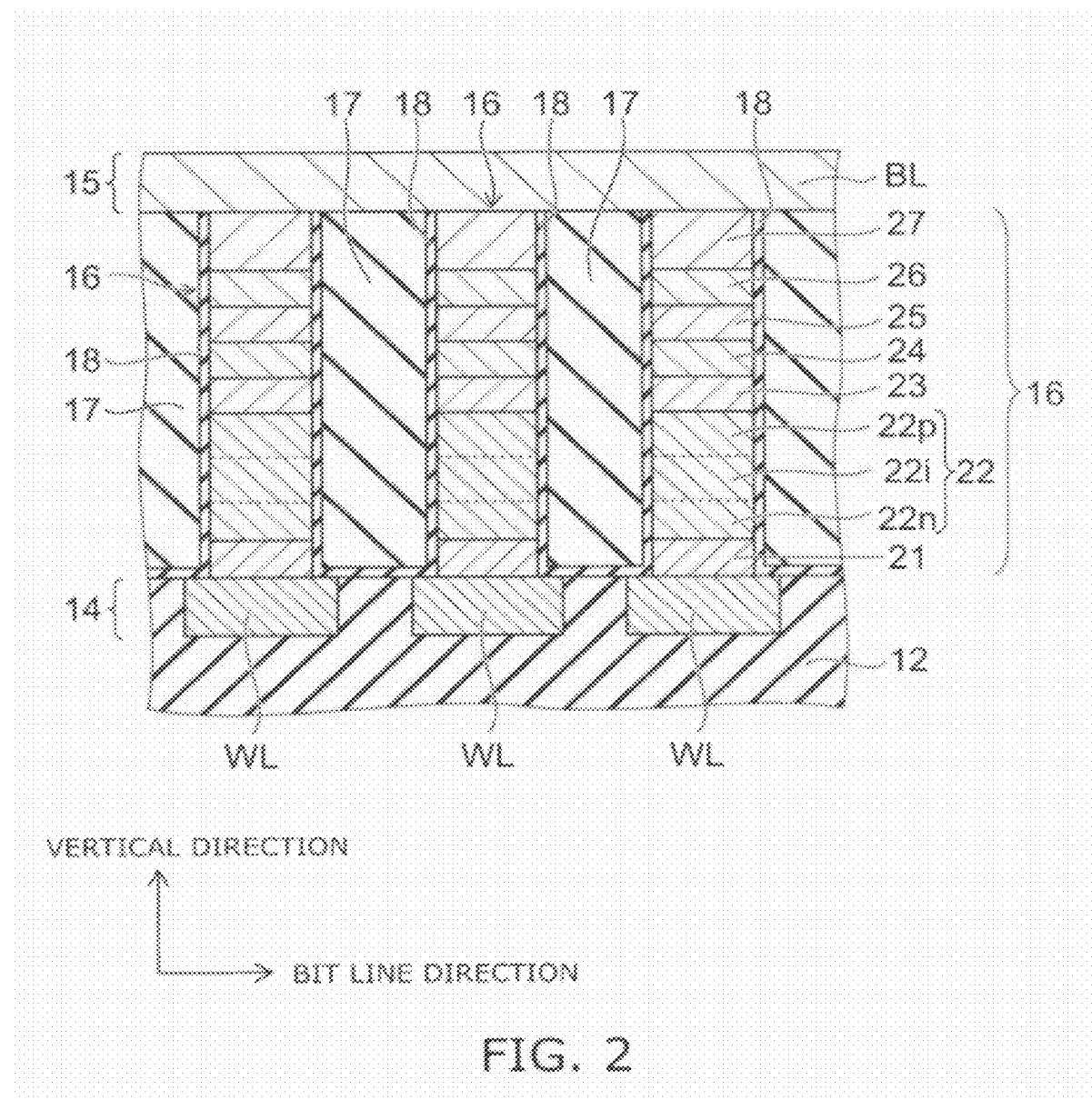
FIG. 2 is a cross-sectional view illustrating a pillar and its vicinity in the semiconductor memory device according to this embodiment.

FIG. 2 is a cross-sectional view illustrating a pillar and its vicinity in the semiconductor memory device according to the embodiment.

The semiconductor memory device according to the embodiment is a ReRAM.

First of all, the feature points of the embodiment will be roughly described.

In the semiconductor memory device according to the embodiment, pillars are connected between bit lines and word lines. These constitute memory cells. Each pillar includes a variable resistance film and a pin-type silicon diode. The pillar is designed in a way that a current flows in a direction in which the pillar extends. A silicon oxide film produced from polysilazane (PSZ) (hereinafter referred to as a "PSZ film") is provided around the pillar. The pillar is embedded in this PSZ film. The direction in which the pillar extends, that is to say, the direction in which the current flows coincides with a film thickness direction of the PSZ film. In addition, an internal stress which tends to contract the PSZ film in the film thickness direction occurs in the PSZ film. This makes the PSZ film apply a compressive force to the pillar in the direction of the current. As a result, the amount of forward current flowing through the silicon diode is increased.

Next, detailed descriptions will be provided for the semiconductor memory device according to the embodiment.

As shown in FIG. 1, the semiconductor memory device 1 according to the embodiment includes a silicon semiconductor 11. A driver circuit (not illustrated) of the semiconductor memory device 1 is formed in an upper portion and a top surface of the silicon substrate 11. An interlayer insulating film 12 made, for instance, of silicon oxide is provided on the silicon substrate 11 in a way that the driver circuit is embedded in the interlayer insulating film 12. A memory cell section 13 is provided on the interlayer insulating film 12.

In the memory cell section 13, word line interconnection layers 14 and bit line interconnection layers 15 are alternately laminated with insulating layers being interposed in between. Each word line interconnection layer 14 includes multiple word lines WL extending in one direction (hereinafter referred to as a "word line direction") in parallel with the top surface of the silicon substrate 11. Each bit line interconnection layer 15 includes multiple bit lines BL extending in a direction (hereinafter referred to as a "bit line direction"): which is in parallel with the top surface of the silicon substrate 11; and which crosses over, for instance, is orthogonal to the word line direction. The word lines WL and the bit lines BL are made of, for instance, tungsten (W). None of the word lines WL are in contact with one another. None of the bit lines BL are in contact with one another. Any one of the word lines WL and any one of the bit lines BL are not in contact with each other.

Pillars 16 extending in a direction (hereinafter referred to as a "vertical direction") perpendicular to the top surface of the silicon substrate 11 are provided at points at which the word lines WL and the bit lines BL are closest to each other. Each of the pillars 16 is formed between each word line WL and its neighboring bit line BL. One pillar 16 constitutes one memory cell. To put it specifically, the semiconductor memory device 1 is that of a cross-point type including the memory cells which are arranged at points at which the word lines WL and the bit lines BL are closest to each other, respectively.

A PSZ film 17 (see FIG. 2) is filled among the word lines WL, the bit lines BL and the pillars 16. The PSZ film 17 is made of a silicon oxide ($SiO_2$) produced from polysilazane. An internal stress which tends to contract the PSZ film 17 in the film thickness direction (in the vertical direction) occurs in the PSZ film 17. Detailed description will be provided for a method of forming the PSZ film 17 later. The PSZ 17 is an interlayer insulating film in which the word lines WL, the bit lines BL and the pillars 16 are buried. The PSZ 17 is a compressive force applying member for applying a compressive force to the pillars 16 in the vertical direction. Furthermore, a liner film 18 made of, for instance, silicon nitride is provided on the lateral faces of each pillar 16.

Hereinbelow, descriptions will be provided for the configuration of the pillars 16 with reference to FIG. 2.

The pillars 16 are classified into two types. The pillars 16 of a first type are pillars under each of which a word line WL is arranged, and above each of which a bit line BL is arranged. The pillars 16 of a second type are pillars under each of which a bit line BL is arranged, and above each of which a word line WL is arranged. FIG. 2 shows pillars under each of which a word line WL is arranged, and above each of which a bit line BL is arranged. In each pillar 16, a lower electrode film 21, a silicon diode 22, an intermediate electrode film 23, a barrier metal 24, a variable resistance film 25, a barrier metal 26 and an upper electrode film 27 are laminated in this sequence from the bottom (at the side of the word line) to the top (at the side of the bit line). The lower electrode film 21 is in contact with the word line WL, and the upper electrode film 27 is connected to the bit line BL.

The lower electrode film 21 is made of, for instance, titanium nitride (TiN), and has a film thickness of, for instance, 1 to 10 nm. The silicon diode 22 is made of polysilicon. The silicon diode 22 is made by laminating an n-type layer $22n$, an i-type layer $22i$ and a p-type layer $22p$ sequentially from the lower layer. In this respect, the n-type layer $22n$ has $n^+$-type conduction; the i-type layer $22i$ is made of an intrinsic semiconductor; and the p-type layer $22p$ has $P^+$-type conduction. Because of this configuration, the silicon diode allows a current to flow through the silicon diode only when an electric potential higher than that applied to the word line WL is applied to the bit line BL, and allows no reverse current to flow through the silicon diode. Note that, in the case of each pillar 16 under which the bit line BL is arranged, and above which the word line WL is arranged, the n-type layer $22n$, the i-type layer $22i$ and the p-type layer $22p$ are laminated into the silicon diode in the reverse sequence. However, the rest of the lamination structure of the pillar 16 under which the bit line BL is arranged is the same as the rest of the lamination structure of each pillar 16 under which the word line WL is arranged. To put it specifically, the n-type layer $22n$, the i-type layer $22i$, and the p-type layer $22p$ are arranged in the film thickness direction of the PSZ film 17. The intermediate electrode film 23 is made of, for instance, titanium silicide (TiSi$_2$). The variable resistance film 25 is made of, for instance, a metal oxide. The variable resistance film 25 can have two or more resistances, and can switch among the resistances when a predetermined electric signal is inputted into the variable resistance film 25.

Next, descriptions will be provided for a method of manufacturing the semiconductor memory device according to the embodiment.

FIGS. 3 to 11 are process cross-sectional views illustrating the method for manufacturing the semiconductor memory device according to the embodiment.

First of all, as shown in FIG. 1, the driver circuit for driving the memory cell section 13 is formed on the top surface of the silicon substrate 11. Subsequently, the interlayer insulating film 12 is formed on the resultant silicon substrate 11. Thereafter, contacts (not illustrated) which reach the driver circuit are formed in the interlayer insulating film 12.

Figure 3:
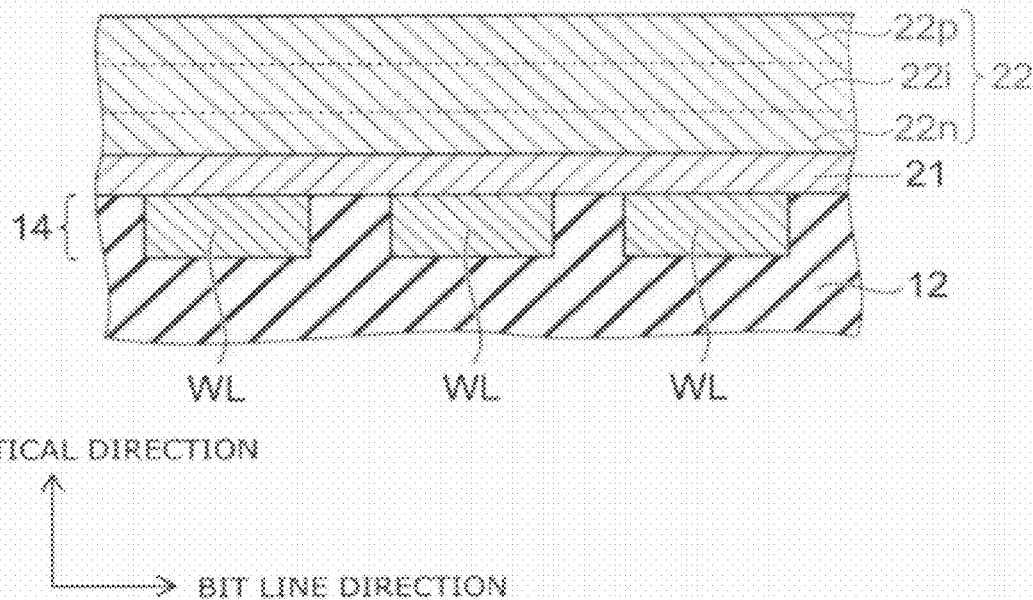

Afterward, as shown in FIG. 3, multiple word lines WL are formed in parallel with one another in a way to extend in the word line direction by burying tungsten in the inside of an upper portion of the interlayer insulating film 12, for instance, by a damascene process. The word line interconnection layer 14 is formed of these word lines WL. After that, titanium nitride (TiN) with a thickness of, for instance, 1 to 10 nm is deposited on the word line interconnection layer 14. Thereby, the lower electrode film 21 is formed. The lower electrode film 21 is a barrier film for inhibiting the reaction between tungsten of which the word lines WL are made and silicon of which the silicon diode 22 is formed. It should be noted that the lower electrode film 21 may be made of, for instance, tantalum nitride (TaN) or tungsten nitride (WN).

Subsequently, amorphous silicon is deposited on the lower electrode film 21. At this time, the n-type layer 22$n$, the i-type layer 22$i$ and the p-type layer 22$p$ are continuously formed by doping the amorphous silicon with the respective impurities while depositing the amorphous silicon. To put it specifically, the n-type layer 22$n$ is formed by doping the amorphous silicon with an impurity which serves as donors, for instance, phosphorus (P) while depositing the amorphous silicon. The i-type layer 22$i$ is formed by depositing the amorphous silicon without doping the amorphous silicon with any impurity. The p-type layer 22$p$ is formed by doping the amorphous silicon with an impurity which serves as acceptors, for instance, boron (B) while depositing the amorphous silicon. Thereby, the pin-type silicon diode 22 is formed. For instance, the film thickness of the n-type layer 22$n$ is set at 2 to 25 nm, and the concentration of phosphorus in the n-type layer 22$n$ is set at $1\times10^{20}$ to $1\times10^{21}$ cm$^{-3}$. The film thickness of the i-type layer 22$i$ is set at 50 to 120 nm. The film thickness of the p-type layer 22$p$ is set at 2 to 25 nm, and the concentration of boron in the p-type layer 22$p$ is set at $1\times10^{20}$ to $1\times10^{21}$ cm$^{-3}$.

Thereafter, the amorphous silicon of which the silicon diode 22 is formed is crystallized by subjecting the amorphous silicon to a thermal treatment (crystallization anneal), and the impurities contained in the amorphous silicon are simultaneously activated. The temperature of this thermal treatment should be set at, for instance, 600 to 900° C. for the purpose of making larger crystal grains. In a case where the amorphous silicon is subjected to the thermal treatment at a mid-low temperature of 600° C. for several hours, polysilicon grains with a relatively large grain size of approximately 400 nm can be formed.

Figure 4:
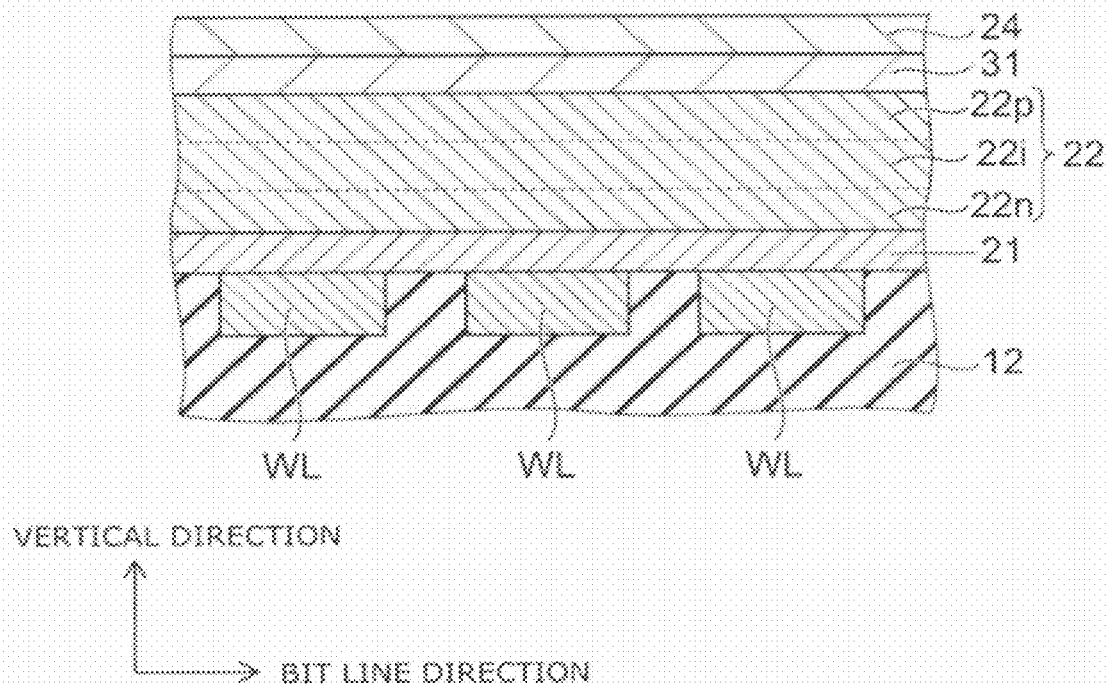

Afterward, as shown in FIG. 4, a metal layer 31 is formed on the silicon diode 22. The metal layer 31 is formed for the purpose of realizing an ohmic contact between the metal layer 31 and the silicon diode 22 through forming silicide between the metal layer 31 and the silicon diode 22. It is desirable that the material for the metal layer 31 should be a metal: which is capable of reducing a natural oxide film formed on the top surface of the silicon diode 22; and whose melting point is high enough for the formed silicide not to be agglomerated by the ensuing thermal treatment. It is desirable that the material therefore should be titanium (Ti), for instance. The thickness of the metal layer 31 is set at, for instance, 1 to 10 nm.

After that, the barrier metal 24 is formed on the metal layer 31. It is desirable that the barrier metal 24 should be formed from titanium nitride (TiN) from the viewpoint of its diffusion preventive properties and a switching performance of the variable resistance film 25 (see FIG. 2) which will be formed next. The thickness of the barrier metal 24 is set at, for instance, 10 nm.

Figure 5:
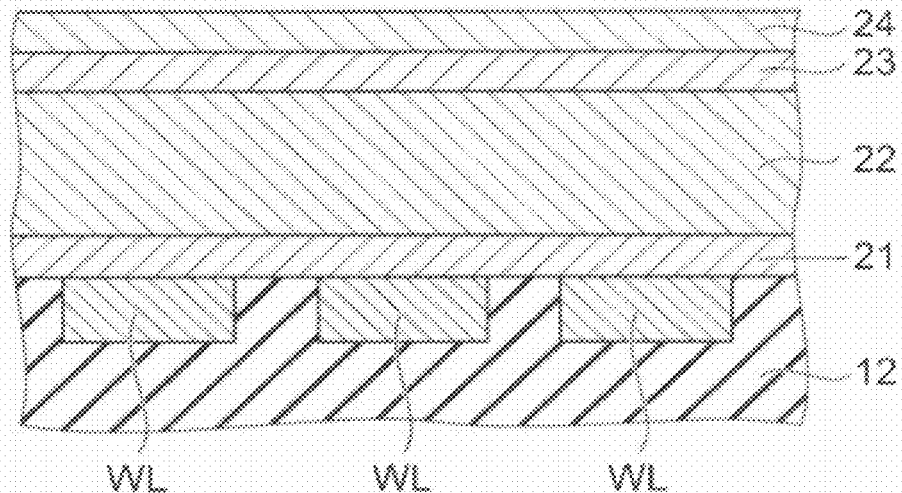

Subsequently, as shown in FIG. 5, the resultant substrate is subjected to a thermal treatment (silicide annealing). The temperature of this thermal treatment should be set at, for instance, 500 to 750° C. Thereby, silicon contained in the silicon diode 22 is diffused into the metal layer 31 (see FIG. 4), and thus reacts with titanium of which the metal layer 31 is made. Consequently, the intermediate electrode film 23 made of titanium silicide (TiSi$_2$) is formed. At this time, the barrier metal 24 made of titanium nitride (TiN) remains almost intact.

Figure 6:
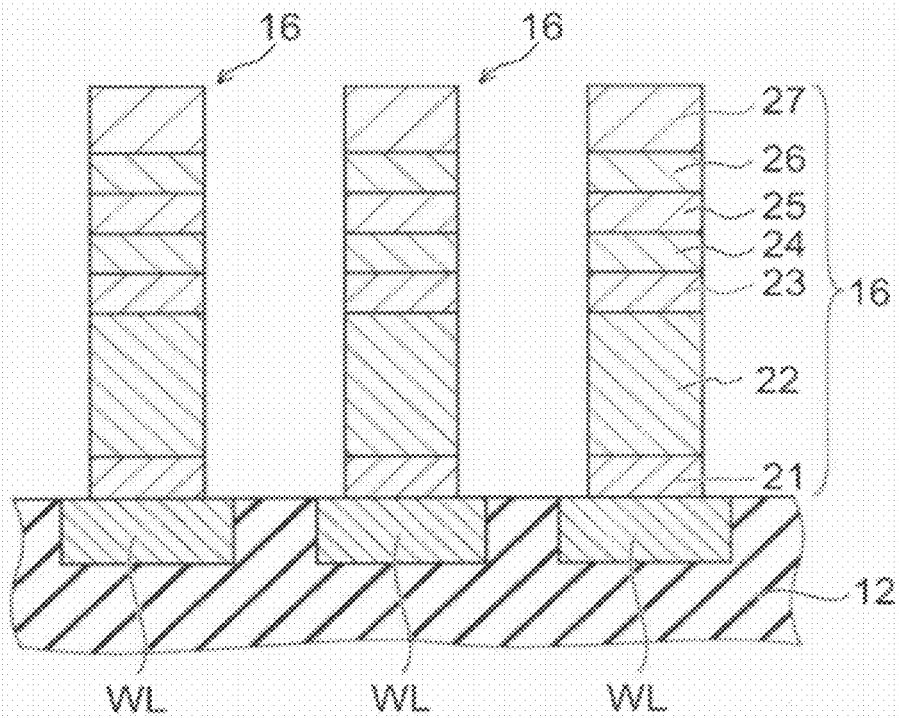

Thereafter, as shown in FIG. 6, the variable resistance film 25 is formed on the barrier metal 24. Afterward, the barrier metal 26 made of, for instance, titanium nitride (TiN) is formed thereon. After that, the upper electrode film 27 made of, for instance, tungsten is formed thereon. The film thickness of the upper electrode film 27 is set at, for instance, 50 to 150 nm. Subsequently, a mask material for forming a pattern is formed thereon by depositing a silicon oxide film whose material is TEOS (tetraethyl orthosilicate) and a silicon nitride film. This mask material is patterned by lithography. Thereby, a mask pattern (not illustrated) is formed.

Afterward, RIE (reactive ion etching) is applied to the resultant substrate by using this mask pattern as the mask. Thus, the upper electrode film 27, the barrier metal 26, the variable resistance film 25, the barrier metal 24, the intermediate electrode film 23, the silicon diode 22 and the lower electrode film 21 are selectively removed, and are segmented in the word line direction and the bit line direction. Thereby, multiple pillars 16 are formed on the respective word lines WL. The aspect ratio of the pillars 16 is set at, for instance, from 1 to 8. It is desirable that the aspect ratio of the pillars 16 should be set at, for instance, from 4 to 8. After that, the resultant substrate is cleaned with, for instance, a chemical solution containing hydrogen fluoride. Thereby, reaction products are removed from the tops of the respective lateral faces of each pillar 16.

Figure 7:
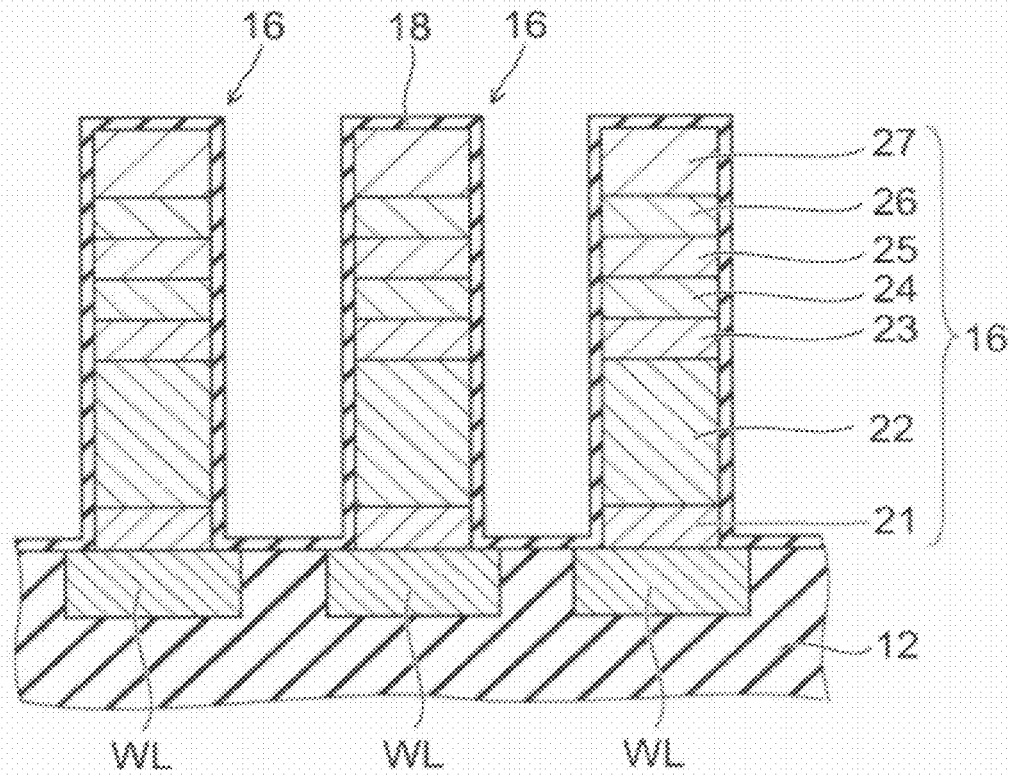

Subsequently, as shown in FIG. 7, the liner film 18 is formed on the top surface and lateral faces of each pillar 16 as well as exposed surfaces of the interlayer insulating film 12 by depositing silicon nitride (SiN) on the top surface and lateral faces of each pillar 16 as well as exposed surfaces of the interlayer insulating film 12 by ALD (atomic layer deposition) of CVD (chemical vapor deposition). Note that the liner film 18 is not limited to the silicon nitride film having a single-layered structure. The liner film 18 may have a three-layered structure including, for instance, a silicon oxide layer, a silicon nitride layer and a silicon oxide layer. In this case, each silicon oxide film may be formed by ALD or LP-CVD (low pressure CVD). Otherwise, each silicon oxide film may be formed by: forming a polysilicon film; and thereafter oxidizing the polysilicon film.

Figure 8:
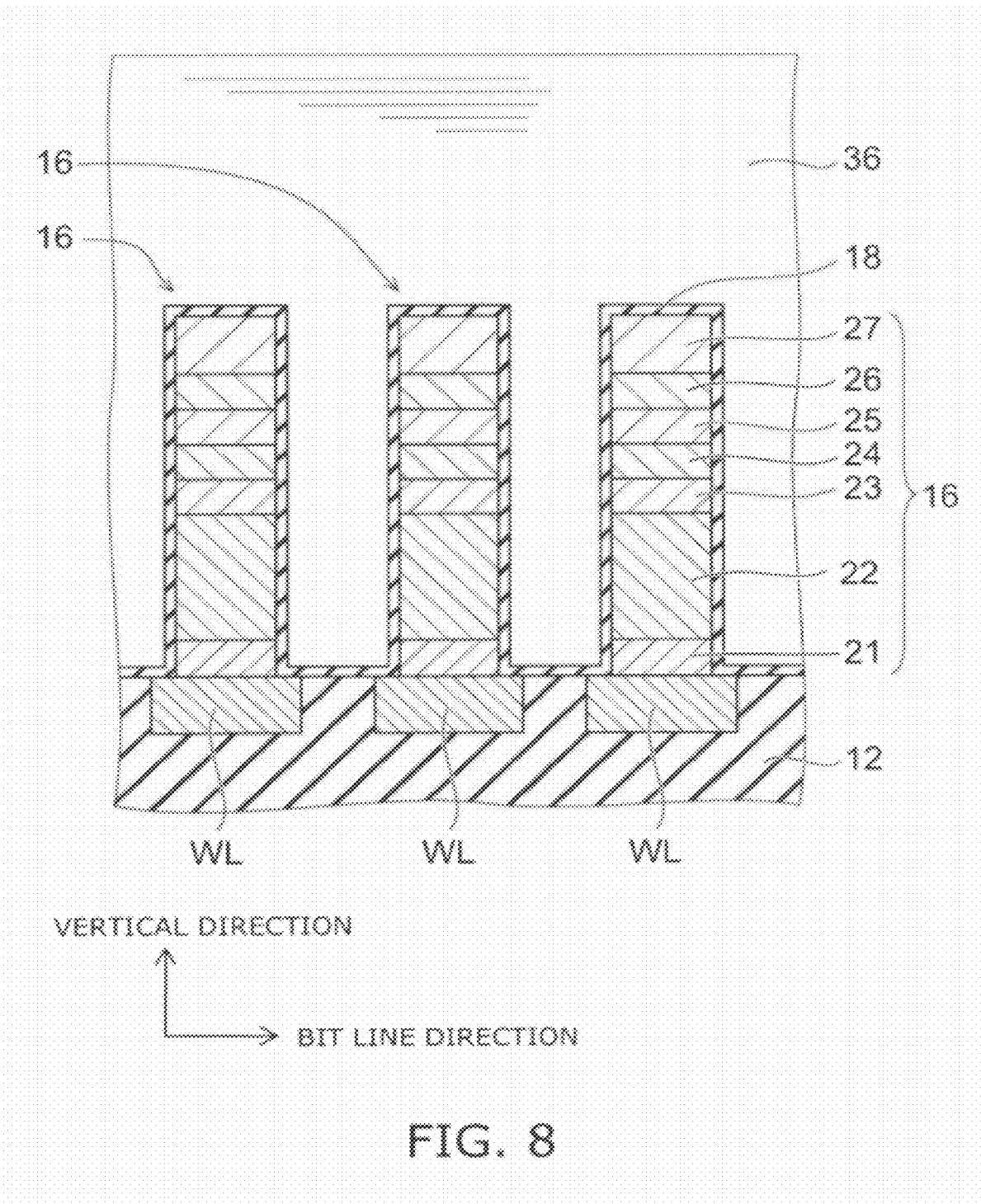

Thereafter, as shown in FIG. 8, a solution (perhydropolysilazane solution) containing perhydrosilazane polymer (($SiH_2$-NH)$_n$) is applied to the resultant substrate by, for instance, spin coating. At this time, a thickness of an applied layer 36 is set fully larger than a height of the pillars 16 in order that: the interstices among the pillars 16 can be filled with the applied layer 36; and the pillars 16 can be completely buried in the applied layer 36. For instance, in a case where the diameter of the pillars 16 is 40 nm and the aspect ratio is 6, the height of the pillars 16 is approximately 300 nm. In this case, the thickness of the applied layer 36 is set at, for instance, 600 nm.

Afterward, as shown in FIG. 9, a thermal treatment (baking process) is applied to the applied layer 36 at a temperature of 200° C. or less, for instance, at a temperature of approximately 150° C. for a time of approximately 3 minutes. This thermal treatment volatilizes a solvent from the perhydropolysilazane solution, and thereby forms the polysilazane film 37. At this time, a hydrolysis reaction and a dehydration condensation reaction occur. As a result, the polysilazane film 37 accordingly contracts to a large extent, and the film thickness of the polysilazane film 37 decreases. Because the polysilazane film 37 is fixedly adhered to the lateral faces of each pillar 16 with the liner film 18 being interposed in between, this contraction applies a compressive force to the pillar in the vertical direction. To put it specifically, the compressive force is applied to the silicon diode 22 in the same direction as the p-type layer 22$p$ and the n-type layer 22$n$ become closer to each other.

Figure 10:
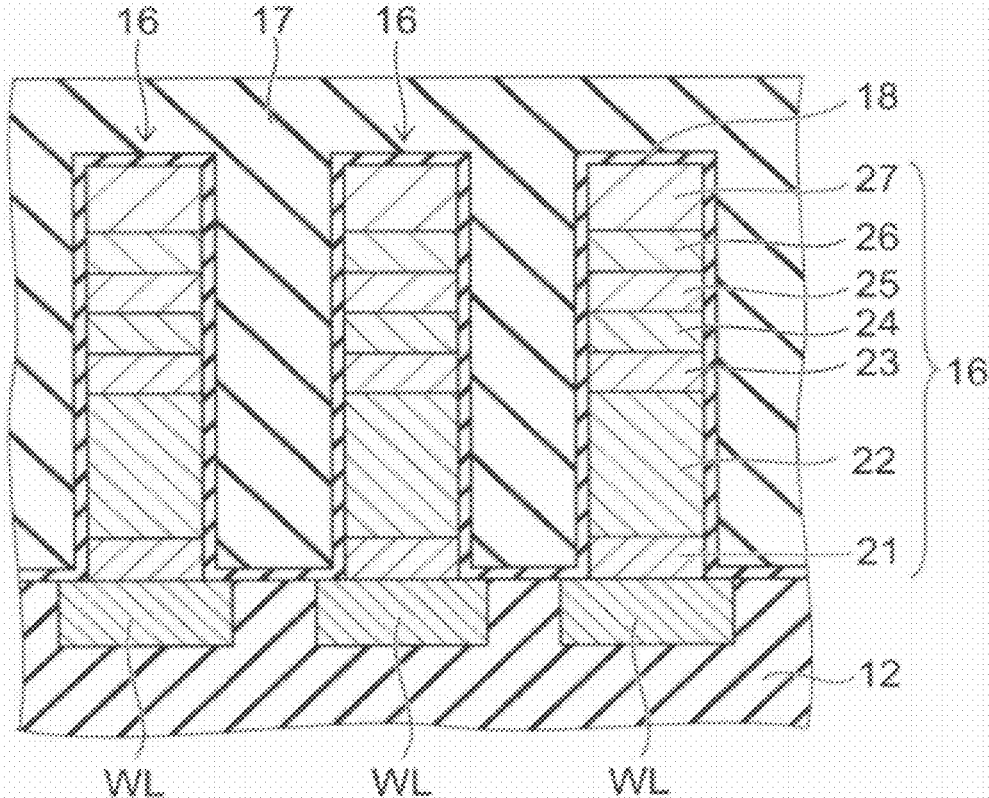

After that, as shown in FIG. 10, an oxidation process is applied to the polysilazane film 37 at a temperature in a range of 200 to 600° C., for instance, at a temperature of 300° C. for a time of approximately 30 minutes in an oxidation atmosphere such as a steam atmosphere. Thereby, polysilazane contained in the polysilazane film 37 turns into silicon oxide, and the PSZ film 17 is accordingly formed. As described above, the PSZ film is a silicon oxide film derived from polysilazane.

Figure 11:
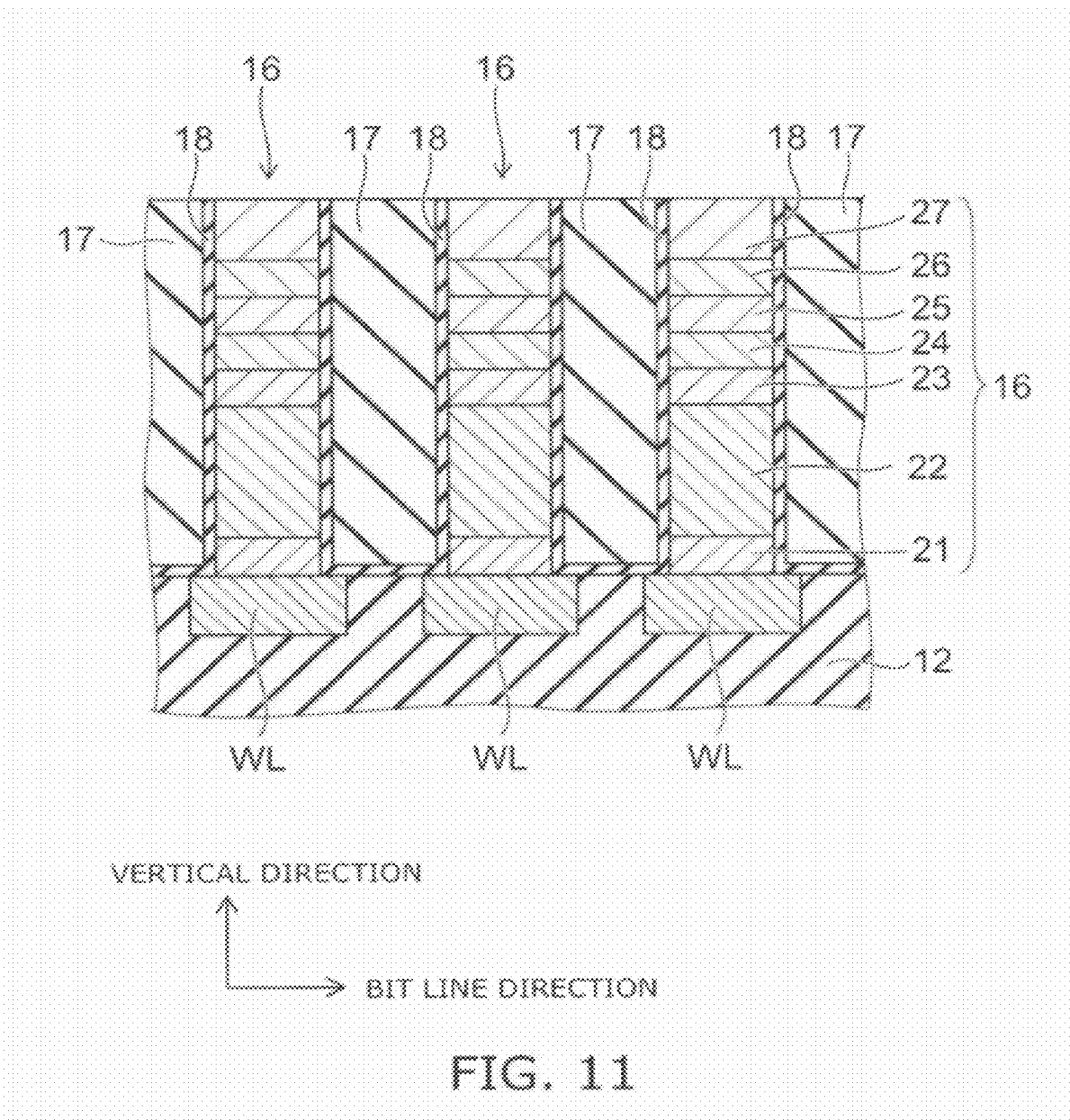

Subsequently, as shown in FIG. 11, CMP (chemical mechanical polishing) is applied to the top surface of the PSZ film 17 by using the upper electrode films 27 as a stopper. Thereby, parts of the PSZ film 17 and parts of the liner film 18 are removed from the tops of the pillars 16, respectively. Accordingly, the upper electrode films 27 are exposed through the PSZ film 17.

Thereafter, as shown in FIG. 2, an interlayer insulating film (not illustrated) is further formed on the PSZ film 17, and bit lines BL are formed in the interlayer insulating film by a damascene process. The bit lines BL are made of, for instance, tungsten. The bit line interconnection section 15 is formed of the multiple bit lines BL. Each bit line BL is connected to the top surfaces of the corresponding multiple pillars 16 arranged in the bit line direction. This means that: each pillar 16 is formed between the corresponding word line WL and the corresponding bit line BL; and the pillar 16 is connected between the word line WL and the bit line BL.

After that, pillars 16 are formed on the bit lines BL. The forming of the pillars 16 is achieved on the basis of a lamination sequence reverse to the lamination sequence in which the n-type layer 22$n$, the i-type layer 22$i$ and the p-type layer 22$p$ have been sequentially laminated into the silicon diode 22 in each pillar 16 formed on the corresponding word line L. Subsequently, the word line interconnection layer 14, the multiple pillars 16, the bit line interconnection layer 15 and the multiple pillars 16 are repeatedly formed in a similar manner. By this, the semiconductor memory device 1 according to the embodiment is produced.

Next, descriptions will be provided for the operation/working-effect of the embodiment.

In the case of the embodiment, the polysilazane film 37 is formed from the applied layer 36 by: forming the pillars 16; thereafter forming the applied layer 36 made of the perhydropolysilazane solution in a way that the pillars 16 are buried in the applied layer 36; and subsequently applying the baking process to the applied layer 36. At this time, the polysilazane film 37 tends to become thinner due to its volume shrinkage. However, because the polysilazane film 37 is arrested by the pillars 16, the polysilazane film 37 cannot become sufficiently thin. For this reason, an internal stress occurs in the polysilazane film 37. Thereby, the polysilazane film 37 applies a compressive force to the pillars 16 in the vertical direction. In other words, the polysilazane film 37 applies the compressive force to the silicon diode 22 in the same direction as the p-type layer 22$p$ and the n-type layer 22$n$ become closer to each other. Consequently, the silicon diode 22 is compressed in the direction of the current. This enhances the mobility of carriers in the silicon diode as a whole, and thus increases the forward current. To put it specifically, the amount of forward current flowing through the compressed silicon diode is approximately 5 times as large as the amount of forward current flowing through the uncompressed silicon diode. Thereby, the forward current can be ensured even though the silicon diode 22 is miniaturized. Accordingly, the margin between a set voltage and a reset voltage can be widened, and thus the malfunction of the silicon diode 22 can be prevented. In this manner, this embodiment makes it easy to obtain highly integrated semiconductor memory device.

It has been familiar that the application of a compressive stress to a single-crystal p-type silicon enhances the mobility of carriers in the single-crystal p-type silicon while the application of a tensile stress to a single-crystal n-type silicon enhances the mobility of carriers in the single-crystal n-type silicon. By contrast, the silicon diode 22 according to this embodiment is a pin-type diode, and accordingly includes both the p-type layer 22$p$ and the n-type layer 22$p$. For this reason, it has been assumed that, even if a compressive force or a tensile force would be applied to this silicon diode, the effect of enhancing the mobility of carries would be offset, and accordingly would not be exerted in the silicon diode 22 as a whole. In addition, because the silicon diode 22 is minute in size, it is difficult to apply a compressive force to the p-type layer alone, and a tensile force to the n-type layer alone. Furthermore, it has been assumed that, even if a force could be applied to the p-type layer 22$p$ or the n-type layer 22$n$ alone, an effect of the applied force on the mobility of carries would be offset in the p-type layer 22$p$ as a whole or in the n-type layer 22$n$ as a whole. That is because: each of the p-type layer 22$p$ and the n-type layer 22$n$ is made of polycrystalline silicon, but not single-crystal silicon; accordingly, crystal orientations of the respective crystal grains in each layer are random; and the overall orientation is low.

Through a series of experiments, however, the inventors have found that the application of a compressive force to the silicon diode 22 in the direction of the current increases the amount of forward current in the silicon diode 22 as a whole. On the basis of this finding, the inventors have applied ingenuity to the structure of the semiconductor memory device 1 in order that a compressive force can be applied to the silicon diode 22. To put it concretely, as described above, the inventors have produced the silicon oxide film (PSZ film) by: forming the pillars 16; thereafter applying the solution, which contains perhydrosilazane polymer, in a way that the pillars 16 are buried in the solution; volatilizing the solvent from this solution; producing the polysilazane film 37 by causing the hydrolysis reaction and the dehydration condensation reaction; and oxidizing the polysilazane film 37. By this, the inventors have formed the PSZ film 17 which is capable of applying a compressive force to the silicon diode 22, and which functions as an interlayer insulating film. This completes the embodiment.

Moreover, in the case of this embodiment, in the process shown in FIG. 3, the silicon diode 22 is formed by depositing amorphous silicon, and this amorphous silicon is subsequently crystallized by applying the thermal process (crystallization anneal) to the amorphous silicon. Thereafter, through the processes shown in FIGS. 8 to 10, the PSZ film 17 is formed. The crystallization of the silicon diode 22 in the unarrested condition is achieved by crystallizing the silicon diode 22 before the PSZ film 17 is formed. This makes it possible to reduce residual stress in the silicon diode 22. As a result, a compressive force to be applied to the silicon diode 22 can be controlled independently by adjusting conditions for forming the PSZ film 17.

Further, in the case of the embodiment, in the process shown in FIG. 7, the liner film 18 made of, for instance, silicon nitride is formed on the lateral faces of each pillar 16. This makes it possible to prevent the oxidation of the upper electrode film 27 made of tungsten, which would otherwise occur due to the attack by a gas and OH groups produced from perhydrosilazane polymer when the applied layer 36 is subjected to the baking process in the process shown in FIG. 8.

Hereinbelow, descriptions will be provided for a desirable dimensional range of each component of the semiconductor memory device according to the embodiment.

A compressive force is transmitted from the PSZ film 17 to each pillar 16 through the lateral faces of the pillar 16. For this reason, as the diameter of the pillar 16 becomes smaller, the efficiency of transmission of the compressive force becomes higher, and the effect of increasing the forward current is accordingly enhanced. To put it specifically, in a case where the diameter of the pillar 16 is 100 nm or less, this effect is larger. For instance, the pillar with a diameter of 43 nm increased the forward current more than the pillar with a diameter of 250 nm.

For the same reason, as the aspect ratio of the pillar 16 becomes larger, the efficiency of transmission of the compressive force becomes higher. Meanwhile, an excessively high aspect ratio of the pillar 16 makes it difficult to process the pillar 16. Against this background, there is a desirable range of the aspect ratio of the pillar 16. To put it specifically, it is desirable that the aspect ratio of the pillar 16 should be from 1 to 8. It is desirable that the aspect ratio thereof should be from 4 to 8.

In addition, as the distance between each two neighboring pillars 16 becomes longer, a larger amount of PSZ film 17 is placed between the pillars 16, and the compressive force applied to the pillars 16 accordingly becomes larger. To put it specifically, in a case where the diameter of each pillar 16 is set at one unit length, if the distance between each two neighboring pillars 16 is equal to or longer than 0.7 unit length, a sufficiently large compressive force can be applied to the pillars 16.

Furthermore, because the compressive force is transmitted from the PSZ film 17 to each pillar 16 through the liner film 18, it is desirable that the liner film 18 should be thinner from the standpoint of the transmission of the compressive force. On the other hand, it is necessary that the liner film 18 should be formed as a continuous film from the standpoint of the protection of the upper electrode films 27. To put it specifically, it is desirable that the film thickness of the liner film 18 should be equal to or less than a quarter of the diameter of the pillars 16, and more specifically in a range of 1 to 25 nm.

Moreover, it is desirable that the grain size of silicon crystal grains constituting each pillar 16 should be equal to or more than the radius of the pillar 16. In other words, it is desirable that each pillar 16 should be formed from one to three crystal grains.

Next, descriptions will be provided for an experimental example demonstrating the effects of the embodiment.

FIGS. 12A and 12B are cross-sectional views illustrating the semiconductor memory device according to the embodiment. FIG. 12C is a cross-sectional view illustrating a sample which was used as an evaluation object in this experimental example. FIG. 12D is a partially-enlarged cross-sectional view showing a silicon diode and its vicinity in the sample shown in FIG. 12C.

FIGS. 13A to 13D are diagrams showing the sample which was used as the evaluation object in the experimental example. FIG. 13A is a perspective view of the sample; FIG. 13B is a perspective cross-sectional view of the sample; FIG. 13C is a partially-enlarged perspective cross-sectional view of the sample; and FIG. 13D is a partially-enlarged cross-sectional view of the sample.

As shown in FIGS. 12A and 12B, the pillars 16 are formed between the word lines WL extending in the word line direction and the bit lines BL extending in the bit line direction in the semiconductor memory device 1 according to the embodiment. The silicon diodes 22 are formed in the respective pillars 16. By contrast, as shown in FIGS. 12C to 12D and 13A to 13D, the sample S1 which was used as the evaluation object in this experimental example was a model which was symmetrical with respect to an axis extending in the vertical direction (the X direction). To put it specifically, in the case of the sample S1, each pillar 16 was shaped like a circular truncated cone which became progressively narrowed toward an upper end, and a tungsten part 52 was filled fully above and below the pillar 16. In addition, the variable resistance film 25 and the barrier metal 26 were omitted from the pillar 16. A part S shown in FIG. 12C was a simulation range selected for this experimental example.

The material and dimension of each component included in the sample S1 are shown in FIGS. 12C to 12D and 13A to 13D. To put it concretely, the tungsten part 52 placed above and below the pillar 16 was set at 125 nm in height. The lower electrode film 21 was made of titanium nitride (TiN), and was set at 10 nm in thickness. The silicon diode 22 was made of polysilicon, and was set at 150 nm in thickness. The intermediate film 23 was made of titanium silicide (TiSi), and was set at 7.5 nm in thickness. The barrier metal 24 was made of titanium nitride (TiN), and was set at 10 nm in thickness. The upper electrode film 27 was made of tungsten (W), and was set at 60 nm in thickness. The lower end portion of the silicon diode 22 was set at 54 nm in diameter, and the upper end portion of the silicon diode 22 was set at 43 nm in diameter. The liner layer 18 was made of silicon nitride (SiN), and was set at 4 nm in thickness. The distance between each two pillars 16 was set at 52 nm from the viewpoint of the lower ends of the respective pillars 16. In addition, the PSZ film 17 was made of silicon oxide (PSZ) derived from polysilazane, and the shrinkage rate of the PSZ film was set at 15%. In other words, the PSZ film 17 was designed in that, while not arrested by the outside, its volume shrank by 15% due to the baking process.

For this experimental example, samples S2, S3, S4 were also evaluated in addition to the above-described sample S1. As described above, the sample S1 was modeled after the semiconductor memory device 1 according to the embodiment, and was an example of the invention. The sample S2 was obtained by eliminating the liner film 18 from the sample S1, and was another example of the invention. The sample 3 was a comparative example. The sample 3 included, as the interlayer insulating film, a silicon oxide film (a HDP (high density plasma) film 53, see FIG. 14D) deposited by HDP-CVD (high density plasma-chemical vapor deposition) instead of the silicon oxide film (the PSZ film 17) formed from polysilazane as the material, and excluded the liner film 18. The sample S4 was another comparative example. The sample S4 was obtained by: forming the PSZ film 17 on a silicon part 54 (see FIG. 14E) instead of on the tungsten part 52; thereafter forming through-holes 55 (see FIG. 15B) in this PSZ film 17; and epitaxially growing the silicon diode 22 in the inside of each through-hole 55.

For each of these samples, stress to occur in each components included in the pillar 15 was simulated. In the simulation, the sequence in which the films had been deposited was also taken into consideration, in a case where the intrinsic stress of any one film was affected. In addition, all the film stresses at room temperature were used with no temperature change being taken into consideration. Table 1 shows property values which were used in the simulation.

TABLE 1

| Material | Young's modulus (GPa) | Poisson's ratio | Coefficient of thermal expansion ($\times 10^{-6}$) | Intrinsic stress (GPa) |
|---|---|---|---|---|
| Polysilicon (poly-Si) | 130 | 0.28 | 4.0 | +0.4 |
| Silicon nitride (SiN) | 389 | 0.38 | 4.0 | +1.4 |
| Silicon Oxide ($SiO_2$) | 66 | 0.17 | 0.4 | +1.32 |
| Titanium Silicide (TiSi) | 264 | 0.22 | 12.5 | (Unknown) |
| Titanium/Titanium nitride (Ti/TiN) | 250 | 0.30 | 9.35 | −1.0 |
| Tungsten (W) | 410 | 0.29 | 4.6 | +1.0 |

Figures 14A, 14B, 14C, 14D, 14E:
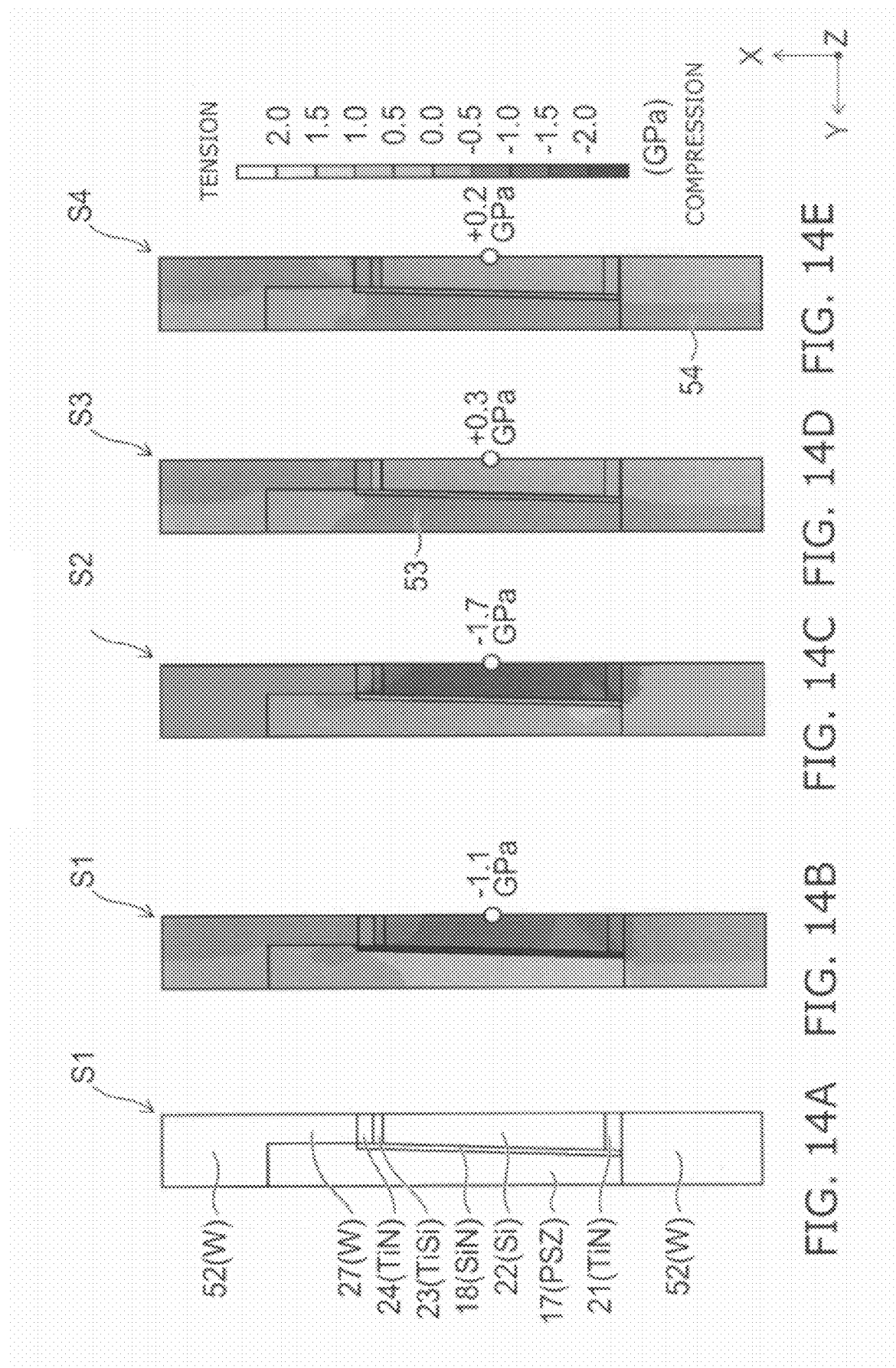
FIGS. 14A to 14E are diagrams respectively illustrating simulation results concerning the experimental example.

FIGS. 14A to 14E are diagrams respectively illustrating simulation results concerning the experimental example. FIG. 14A shows the configuration of the sample S1. FIG. 14B shows the simulation result of the sample S1. FIG. 14C shows the simulation result of the sample S2. FIG. 14D shows the simulation result of the sample S3. FIG. 14E shows the simulation result of the sample S4.

Note that the diagram shown in FIG. 14A is identical to the diagram shown in FIG. 13D. In addition, in FIGS. 14B to 14E, the direction and magnitude of stress are indicated by gradations. Furthermore, the numeric values in FIGS. 14B to 14E represent the stresses measured at the centers of the silicon diodes 22, respectively. These numeric values are listed in Table 2. In FIGS. 14B to 14E and Table 2, a positive value represents a tensile stress, and a negative value represents a compressive stress.

TABLE 2

| | Sample | | | |
|---|---|---|---|---|
| Type | S1 Example | S2 Example | S3 Comparative Example | S4 Comparative Example |
| Interlayer insulating film | PSZ film | PSZ film | HDP film | PSZ film |

TABLE 2-continued

| | Sample | | | |
|---|---|---|---|---|
| Type | S1 Example | S2 Example | S3 Comparative Example | S4 Comparative Example |
| Timing of formation of interlayer insulating film | After formation of pillar | After formation of pillar | After formation of pillar | Before formation of pillar |
| Liner film | Present | Absent | Absent | Present |
| Stress (GPa) | −1.1 | −1.7 | +0.3 | +0.2 |

In the case of the sample S1 whose configuration was the closest to the configuration of the semiconductor memory device according to the embodiment, as shown in Table 2 and FIG. 14B, a compressive stress of 1.1 GPa occurred at the center of the silicon diode 22. In addition, in the case of the sample S2 including no liner film 18, a compressive stress of 1.7 GPa occurred at the center of the silicon diode 22. As mentioned above, the compressive stress occurred in the silicon diode 22 in the case of each example of the invention. The compressive stress was larger in the sample S2 including no liner film 18 than in the sample S1 including the liner film 18.

In contrast, in the case of the sample S3 in which the pillars 16 were buried in the HDP film 53 instead of in the PSZ film 17, as shown in FIG. 14D, a stress at the center of the silicon diode 22 was 0.3 GPa in the tensile direction, and virtually no stress occurred. One may consider that the reason for this is that virtually no volume shrinkage occurred in the HDP film. Furthermore, in the case of the sample S4 whose pillars 16 were filled in the through-holes formed in the PSZ film 17, a stress at the center the silicon diode 22 was 0.2 GPa in the tensile direction, and virtually no stress occurred.

Descriptions will be provided for what made the sample S1 and the sample S4 different from each other.

FIG. 15A is a schematic cross-sectional view illustrating a process of forming a pillar and a PSZ film in the sample S1. FIG. 15B is a schematic cross-sectional view illustrating a process of forming a PSZ film and a pillar in the sample S4.

In the case of the sample S1, as shown in FIG. 15A, a pillar 16 was formed, and thereafter an applied film 36 made from a perhydropolysilazane solution was formed around the pillar 16. Subsequently, a polysilazane film 37 was formed from the applied film 36 by a baking process. In addition, an oxidation process was applied to the polysilazane film 37, and a silicon oxide film (PSZ film 17) was thus formed. During this process, the polysilazane film 37 tended to become thinner through volume shrinkage. However, the polysilazane film 37 was not able to become sufficiently thin, because the polysilazane film 37 was arrested by the pillar 16. Accordingly, the polysilazane film 37 applied a compressive force to the pillar 16.

In contrast, in the case of the sample S4, as shown in FIG. 15B, an applied film 36 was formed from a perhydropolysilazane solution, and a PSZ film 17 was thereafter formed from this applied film 36. During this process, the PSZ film 17 became thinner through volume shrinkage. However, no pillar had been formed yet. For this reason, the PSZ film 17 was able to shrink its volume freely without being arrested by its outside, and virtually no internal stress occurred in the PSZ film 17. In addition, a through-hole 55 was made in the PSZ film 17 after the PSZ film 17 was deposited and shrank, and a silicon diode 22 was thereafter epitaxially grown in the inside of the through-hole 55. For this reason, the silicon diode 22 exerted no force on the PSZ film 17, and vice versa. Accordingly, no compressive force was applied to the silicon diode 22.

As described above, in the case of the sample 1 which was one example of the invention, because the PSZ film 17 was formed after the pillar 16 was formed, a compressive force was applied to the silicon diode 22, and the amount of forward current resultantly increased. By contrast, in the case of the sample 4 which was one comparative example, because the pillar 16 was formed after the PSZ film was formed, no compressive force was applied to the silicon diode 22, and the amount of forward current did not increase in the silicon diode 22.

Next, descriptions will be provided for the influence of the shrinkage rate of the PSZ film 17 on the compressive force applied to the silicon diode.

FIG. 16A is a diagram showing the configuration of the sample S1. FIG. 16B is a diagram showing a simulation result of the sample S1 which was obtained in a case where the shrinkage rate of the PSZ film was set at 15%. FIG. 16C is a diagram showing a simulation result of the sample S1 which was obtained in a case where the shrinkage rate of the PSZ film was set at 25%.

Note that: the drawing shown in FIG. 16A is identical to the drawing shown in FIG. 14A; and the drawing shown in FIG. 16B is identical to the drawing shown in FIG. 14B.

As shown in FIGS. 16B and 16C, the magnitude of a compressive stress which occurred at the center of the silicon diode 22 was 1.1 GPa in the case where the shrinkage rate of the PSZ film was set at 15%, and 1.8 GPa in the case where the shrinkage rate of the PSZ film was set at 25%. In other word, when the shrinkage rate was increased by approximately 1.7 times, the compressive stress was increased by approximately 1.6 times. In this manner, as the shrinkage rate of the PSZ film increased, the compressive force applied to the silicon diode 22 increased. The shrinkage rate of the PSZ film can be controlled by adjusting the temperature of the baking process.

Next, descriptions will be provided for the influence of the height of the silicon diode on the compressive force applied to the silicon diode.

Figure 17:
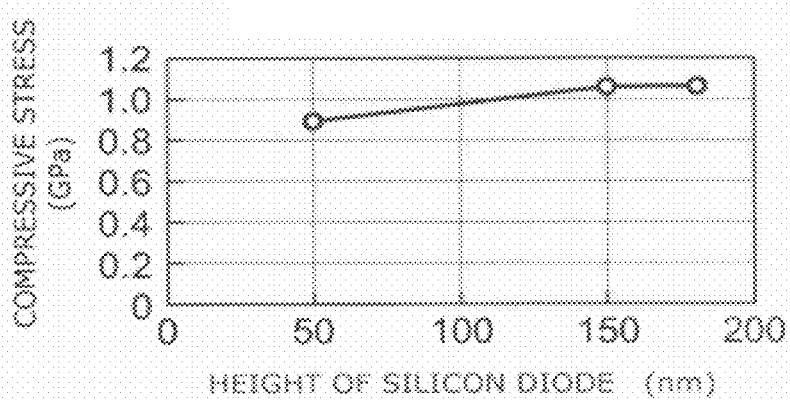
FIG. 17 is a graphic diagram illustrating the influence of the height of the silicon diode on the compressive stress.

FIG. 17 is a graphic diagram illustrating the influence of the height of the silicon diode on the compressive stress with the height of the silicon diode being represented by the horizontal axis, and with the compressive stress at the center of the silicon diode being represented by the vertical axis.

As shown in FIG. 17, as the height of the silicon diode became higher, the compressive stress at the center of the silicon diode became larger. One may consider that the reason for this is that, as the height of the silicon diode became higher, the area of the lateral faces of the silicon diode increased, and the silicon diode became more susceptible to the shrinkage of the PSZ film.

Next, descriptions will be provided for the influence of the thickness of the liner film on the compressive force applied to the silicon diode.

Figure 18:
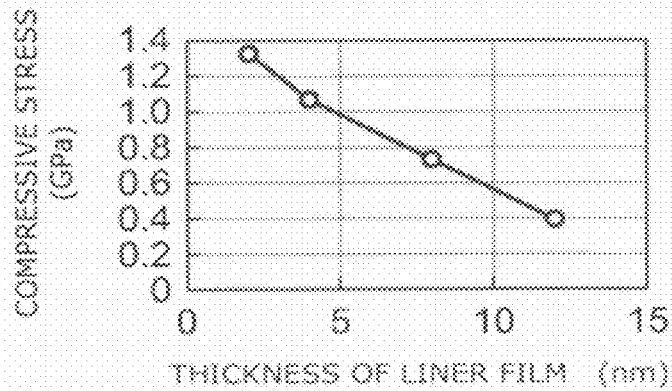
FIG. 18 is a graphic diagram illustrating the influence of the thickness of the liner film on the compressive force.

FIG. 18 is a graphic diagram illustrating the influence of the thickness of the liner film on the compressive force with the thickness of the liner film being represented by the horizontal axis, and with the compressive stress at the center of the silicon diode being represented by the vertical axis.

In this simulation, the liner film was assumed to be made of silicon nitride (SiN), and the internal stress of the liner film was assumed to be a tensile stress of 1.4 GPa.

As shown in FIG. 18, as the thickness of the liner film became thicker, the compressive stress at the center of the silicon diode became smaller. One may consider that the reason for this is that, because the compressive force applied to the silicon diode from the PSZ film was transmitted through the liner film, a thicker liner film relaxed this compressive force more.

Next, descriptions will be provided for the influence of the internal stress of the liner film on the compressive force applied to the silicon diode.

Figure 19:
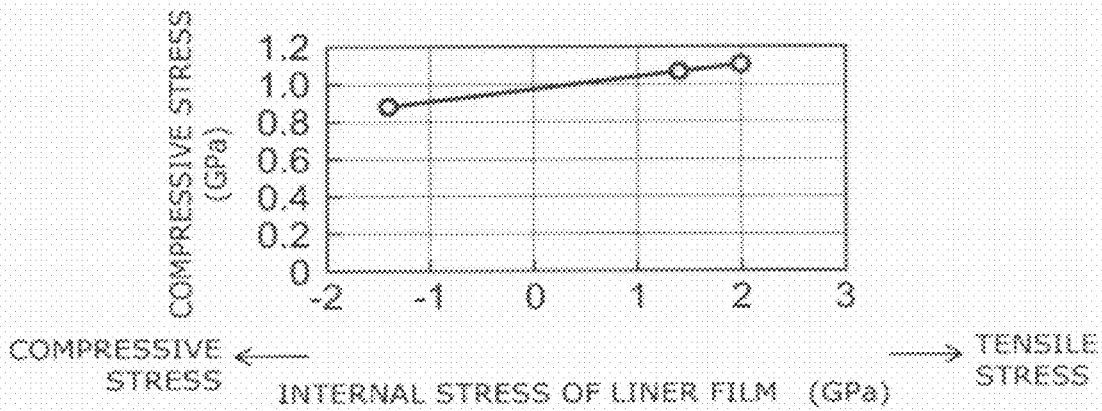
FIG. 19 is a graphic diagram illustrating the influence of the internal stress of the liner film on the compressive force.

FIG. 19 is a graphic diagram illustrating the influence of the internal stress of the liner film on the compressive force with the internal stress of the liner film being represented by the horizontal axis, and with the compressive force at the center of the silicon diode being represented by the vertical axis.

In this simulation, the liner film was assumed to be made of silicon nitride (SiN).

As shown in FIG. 19, the compressive stress applied to the silicon diode was larger in a case where the internal stress of the liner film was a tensile stress than in a case where the internal stress of the liner film was a compressive stress.

Next, descriptions will be proved for an experimental example for measuring distortion of the lattice of the silicon diode.

Figure 20A:
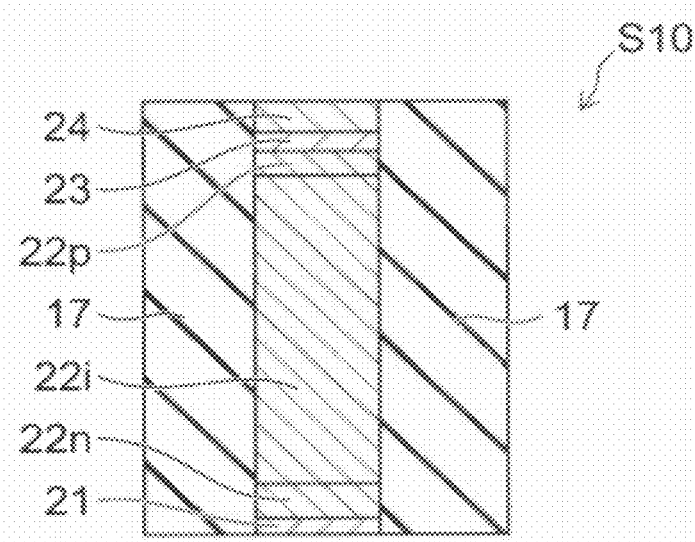
FIG. 20A is a cross-sectional view illustrating a sample which was used as an evaluation object in this experimental example.
Figure 20B:
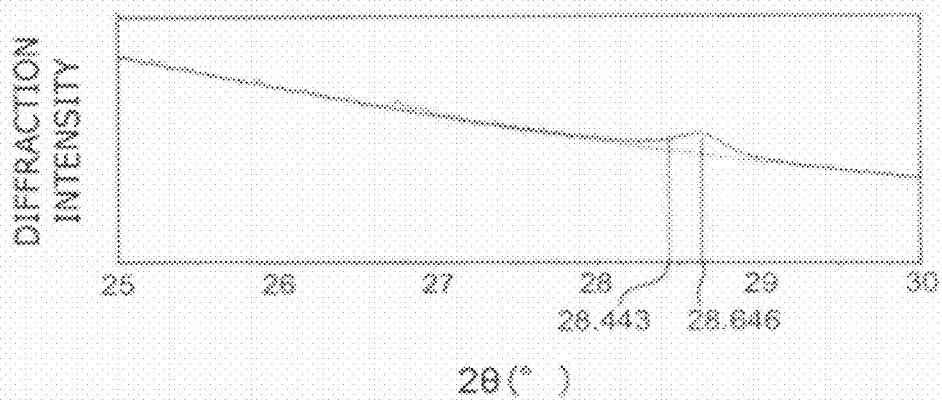
FIG. 20B is a graphic diagram illustrating a result of measuring the (111) peak and FIG. 20C is a graphic diagram illustrating a result of measuring the (220) peak.
Figure 20C:
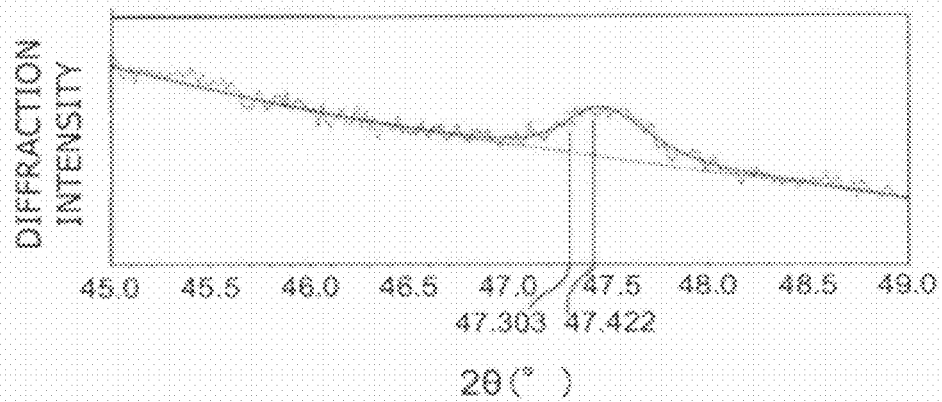

FIG. 20A is a cross-sectional view illustrating a sample which was used as an evaluation object in this experimental example. FIG. 20B is a graphic diagram illustrating a result of measuring the (111) peak. FIG. 20C is a graphic diagram illustrating a result of measuring the (220) peak. Note that in FIGS. 20B and 20C, the horizontal axis represents a value of 2θ, and the vertical axis represents diffraction intensity.

In this experimental example, a sample S10 as shown in FIG. 20A was produced by the method which has been described with regard to the embodiment. In the case of the sample S10, the lower electrode film 21 was made of titanium nitride with a thickness of the 5 nm; the n-type layer 22*n* was made of silicon doped with phosphorus with a concentration of $1 \times 10^{21}$ cm$^{-3}$ with a thickness of 3 nm; the i-type layer 22*i* was made of silicon with a thickness of 77 nm; the p-type layer 22*p* was made of silicon doped with boron with a concentration of $2 \times 10^{21}$ cm$^{-3}$ with a thickness of 5 nm; the intermediate electrode film 23 was formed by depositing a titanium layer with a thickness of 1.5 nm, followed by silicidation; and the barrier metal 24 was made of titanium nitride. Subsequently, these layers were processed into pillars. Thereafter, the PSZ film 17 was formed in a way that the pillars were buried in the PSZ film 17. In the sample S10, multiple unit structures each as shown in FIG. 20A were arranged in a matrix array. Afterward, an X-ray was irradiated onto the sample S10 from the top, and the distortion of the lattice of the silicon diode 22 was thereby measured. The measuring method was a θ-2θ method using a Cu-ray with a wavelength of 1.54 angstroms.

As shown in FIG. 20B, the position of the (111) peak of silicon of the sample S10 was at 2θ=28.646°. Judging from the fact that the position of the (111) peak of silicon in the standard sample was at 2θ=28.443°, the space between the (111) planes of silicon was narrower in the silicon diode than in the standard sample. In addition, as shown in FIG. 20C, the position of the (220) peak of silicon of the sample S10 was at 2θ=47.422°. Judging from the fact that the position of the (220) peak of silicon in the standard sample was at 2θ=47.303°, the space between the (220) planes of silicon was narrower in the silicon diode than in the standard sample as well. As described above, in the vertical direction, the lattice constant of silicon in the silicon diode of the sample S10 was smaller than the lattice constant of silicon in the standard sample.

The foregoing descriptions have been provided for the invention with reference to the embodiment. The invention is not limited to this embodiment. Whatever is obtained by those skilled in the art through arbitrarily adding a component(s) to, removing a component(s) from, and/or introducing a design change(s) to the above-described embodiment, and whatever is obtained by those skilled in the art through arbitrarily adding a process(es) to, omitting a process(es) from, and/or introducing a condition change(s) to the above-described embodiment shall be included in the scope of the invention as long as they embody the gist and spirit of the invention. For instance, the silicon diode may be instead a pn-type diode including no i-type layer. In addition, the silicon diode may contain a component(s) other than silicon and impurities which are used as donors and acceptors. For instance, the silicon diode may contain germanium (Ge). Furthermore, the crystallization anneal for crystallizing the silicon diode does not have to be carried out each time amorphous silicon is deposited. Instead, the crystallization anneal may be achieved by crystallizing a batch of amorphous silicon through a high-temperature thermal treatment at a temperature in a range of approximately 700 to 900° after producing the structural body as shown in FIG. 1. In this case, it is desirable that the metal 31 should be made of such a high-melting-point metal that does not agglomerated due to this high-temperature thermal treatment. Note that titanium satisfies this condition.

The above-described embodiment can provide a semiconductor memory device and a method of manufacturing the same, which easily enable high integration of semiconductor memory devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor memory device comprising:
a word line interconnection layer including a plurality of word lines which extend in a first direction;
a bit line interconnection layer including a plurality of bit lines which extend in a second direction crossing over the first direction; and
a pillar arranged between each of the word lines and each of the bit lines,
the pillar including:
a silicon diode having a p-type portion and an n-type portion; and
a variable resistance film,
the word line interconnection layer and the bit line interconnection layer being alternately stacked, and
a compressive force being applied to the silicon diode in a direction in which the p-type portion and the n-type portion become closer to each other.

2. The device according to claim 1, further comprising a silicon oxide film placed around the pillar,
the p-type portion and the n-type portion being arranged in a film thickness direction of the silicon oxide film.

3. The device according to claim 2, wherein
the silicon oxide film is formed by placing a solution containing perhydrosilazane polymer around the silicon diode and heating the solution.

4. The device according to claim 1, wherein
the silicon diode has an i-type portion between the p-type portion and the n-type portion.

5. The device according to claim 1, wherein
the silicon diode is made of polysilicon.

6. The device according to claim 1, further comprising
a liner film provided on a lateral face of the pillar.

7. The device according to claim 6, wherein
the liner film is made of silicon nitride.

8. A semiconductor memory device comprising
a silicon diode including a p-type portion and an n-type portion,
a compressive force being applied to the silicon diode in a direction in which the p-type portion and the n-type portion become closer to each other.

9. The device according to claim 8, further comprising
a silicon oxide film placed around the silicon diode,
the p-type portion and the n-type portion being arranged in a film thickness direction of the silicon oxide film.

10. The device according to claim 9, wherein
the silicon oxide film is formed by placing a solution containing perhydrosilazane polymer around the silicon diode and heating the solution.

11. A method of manufacturing a semiconductor memory device comprising:
forming a word line interconnection layer including a plurality of word lines which extend in a first direction;
forming a bit line interconnection layer including a plurality of bit lines which extend in a second direction crossing over the first direction;
forming a silicon diode by sequentially depositing a p-type silicon and an n-type silicon;
forming a variable resistance film;
forming a pillar by selectively removing a part of the silicon diode and a part of the variable resistance film;
placing a solution containing perhydrosilazane polymer around the pillar; and
forming a silicon oxide film by heating the solution,
the forming the word line interconnection layer and the forming of the bit line interconnection layer being alternately carried out, and
the forming the silicon diode, the forming the variable resistance film, the forming the pillar, the placing the solution, and the forming the silicon oxide film being carried out between the forming the word line interconnection layer and the forming the bit line interconnection layer.

12. The method according to claim 11, wherein
the placing the solution is achieved by applying the solution.

13. The method according to claim 11, wherein
the forming the silicon oxide film includes:
a first thermal treatment process of heating the solution at a first temperature; and
a second thermal treatment process of heating the solution at a second temperature which is higher than the first temperature.

14. The method according to claim 13, wherein
the second thermal treatment process is carried out in an oxidation atmosphere.

15. The method according to claim 11, wherein
the forming the silicon oxide film includes:
a first thermal treatment process of heating the solution for a first length of time; and
a second thermal treatment process of heating the solution for a second length of time which is longer than the first length of time.

16. The method according to claim 15, wherein the second thermal treatment process is carried out in an oxidation atmosphere.

17. The method according to claim 11, wherein
a crystalline structure of each of the p-type silicon and the n-type silicon is amorphous, and
the method further comprises crystallizing the p-type silicon and the n-type silicon after the forming the silicon diode and before the forming the silicon oxide film.

18. The method according to claim 11, further comprising forming a liner film on a lateral faces of the pillar.

19. The method according to claim 18, wherein
the forming the liner film is achieved by depositing silicon nitride.

\* \* \* \* \*